(12) United States Patent
Kim et al.

(10) Patent No.: US 11,758,663 B2
(45) Date of Patent: *Sep. 12, 2023

(54) DISPLAY DEVICE

(71) Applicant: Samsung Display Co., LTD., Yongin-si (KR)

(72) Inventors: Won Tae Kim, Hwaseong-si (KR); Ji Hye Kim, Hwaseong-si (KR); Jae Hyeon Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/892,634

(22) Filed: Aug. 22, 2022

(65) Prior Publication Data

US 2022/0400552 A1 Dec. 15, 2022

Related U.S. Application Data

(63) Continuation of application No. 16/796,601, filed on Feb. 20, 2020, now Pat. No. 11,425,819.

(30) Foreign Application Priority Data

Mar. 28, 2019 (KR) .......................... 10-2019-0035993

(51) Int. Cl.
*H05K 1/02* (2006.01)
*H05K 1/14* (2006.01)
(Continued)

(52) U.S. Cl.
CPC ............... *H05K 1/147* (2013.01); *G09G 3/20* (2013.01); *H05K 1/028* (2013.01); *H05K 1/189* (2013.01);
(Continued)

(58) Field of Classification Search
CPC ........ H05K 1/147; H05K 1/028; H05K 1/189; H05K 5/0017; H05K 2201/056;
(Continued)

(56) References Cited

U.S. PATENT DOCUMENTS 8,755,953 B2 6/2014 Phan et al.
9,043,053 B2 5/2015 Phan et al.
(Continued)

FOREIGN PATENT DOCUMENTS

JP 6233417 11/2017
KR 1020090001907 A 1/2009
(Continued)

*Primary Examiner* — Steven T Sawyer
(74) *Attorney, Agent, or Firm* — CANTOR COLBURN LLP

(57) ABSTRACT

A display device includes a folding area, a first unfolding area located on a side of the folding area, and a second unfolding area located on a second side of the folding area. The display device further includes a display module which includes a display panel, and a first circuit board which is attached to the display panel and disposed under the display module, wherein the first circuit board includes a base film, a first driving integrated circuit ("IC") disposed in the first unfolding area, and a second driving IC disposed in the second unfolding area where the first driving IC and the second driving IC do not overlap each other in a thickness direction during folding.

18 Claims, 20 Drawing Sheets

(51) Int. Cl.
*G09G 3/20* (2006.01)
*H05K 5/00* (2006.01)
*H05K 1/18* (2006.01)

(52) U.S. Cl.
CPC ..... *H05K 5/0017* (2013.01); *H05K 2201/056* (2013.01); *H05K 2201/09063* (2013.01); *H05K 2201/10128* (2013.01)

(58) Field of Classification Search
CPC .......... H05K 2201/09063; H05K 2201/10128; H05K 2201/10136; G09G 3/20; G09G 2300/0426; G09G 2380/02; H01L 51/0097; H01L 2251/5338; G06F 1/16; G06F 1/1652; G06F 1/1641; G06F 2203/04102; G09F 9/301; G09F 9/33; G02F 1/133305; Y02E 10/549
See application file for complete search history.

(56) References Cited

U.S. PATENT DOCUMENTS

| | | | |
|---|---|---|---|
| 9,722,198 B2 | 8/2017 | Murayama et al. | |
| 10,091,880 B2 * | 10/2018 | Nam | H05K 1/0278 |
| 10,396,306 B2 | 8/2019 | Kim et al. | |
| 2010/0103648 A1 | 4/2010 | Kim et al. | |
| 2015/0091434 A1 | 4/2015 | Kim | |
| 2016/0165726 A1 * | 6/2016 | Lee | H05K 1/147 |
| | | | 361/783 |
| 2016/0219706 A1 | 7/2016 | Jo et al. | |
| 2016/0374191 A1 | 12/2016 | Kim et al. | |
| 2018/0182985 A1 | 6/2018 | Kang | |
| 2019/0081262 A1 | 3/2019 | Kim et al. | |
| 2019/0280235 A1 | 9/2019 | Kim et al. | |
| 2019/0326539 A1 | 10/2019 | Chung et al. | |
| 2020/0152109 A1 | 5/2020 | Jung et al. | |

FOREIGN PATENT DOCUMENTS

| | | |
|---|---|---|
| KR | 101140309 B1 | 5/2012 |
| KR | 1020150014433 A | 2/2015 |
| KR | 1020160093429 A | 8/2016 |
| KR | 101695442 B1 | 1/2017 |
| KR | 1020170051667 | 5/2017 |
| KR | 1020180062274 | 6/2018 |
| KR | 1020180073351 | 7/2018 |
| KR | 1020190029470 | 3/2019 |
| KR | 1020190079111 | 7/2019 |
| KR | 1020190107506 A | 9/2019 |
| KR | 1020190110046 A | 9/2019 |

* cited by examiner

FRONT: FA, UFA1, UFA2

BACK: FA, UFA1, UFA2

BACK: FA, UFA1, UFA2

BACK: FA, UFA1, UFA2

BACK: FA, UFA1, UFA2

FRONT: FA, UFA1, UFA2
300_2: 311, 312

DISPLAY DEVICE

This application is a continuation of U.S. patent application Ser. No. 16/796,601, filed on Feb. 20, 2020, which claims priority to Korean Patent Application No. 10-2019-0035993, filed on Mar. 28, 2019, and all the benefits accruing therefrom under 35 U.S.C. § 119, the content of which in its entirety is herein incorporated by reference.

BACKGROUND

1. Field

Exemplary embodiments of the invention relate to a display device, and more particularly, to a foldable display device that may switch between a folded state and an unfolded state.

2. Description of the Related Art

A display device displays an image and includes a display panel such as an organic light emitting display panel or a liquid crystal display panel. Display devices are applied not only to fixed electronic devices such as televisions and monitors but also to mobile electronic devices such as smartphones and tablet personal computers ("PCs") in order to provide images to users. Recently, there is a growing demand for mobile electronic devices having a relatively small volume or thickness while having a larger display screen, and foldable or bendable display devices that may be folded and unfolded so as to provide a larger screen only during a use are being developed.

SUMMARY

Exemplary embodiments of the invention provide a display device in which driving integrated circuits ("ICs") disposed on a flexible printed circuit board are prevented from contacting each other during bending.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention provides a display device including a folding area, a first unfolding area located on a side of the folding area, and a second unfolding area located on a second side of the folding area. The display device further includes a display module which includes a display panel, and a first circuit board which is attached to the display panel and disposed under the display module, where the first circuit board includes a base film, a first driving IC disposed in the first unfolding area, and a second driving IC disposed in the second unfolding area, where the first driving IC and the second driving IC do not overlap each other in a thickness direction during folding.

In an exemplary embodiment, a first indented portion may be recessed from a first edge of the first circuit board attached to the display panel in the folding area.

In an exemplary embodiment, the display device may further include a second circuit board which includes a first base substrate attached to the first unfolding area of a second edge facing the first edge of the first circuit board and a second base substrate attached to the second unfolding area of the second edge, where a second indented portion of the first circuit board is recessed from the second edge in the folding area.

In an exemplary embodiment, a first width of the first indented portion in a direction from the first unfolding area toward the folding area may be smaller than a second width of the second indented portion in the direction from the first unfolding area toward the folding area.

In an exemplary embodiment, a plurality of folding holes may be defined in the first circuit board between the first indented portion and the second indented portion in the folding area, where the plurality of folding holes passes through the first circuit board in the thickness direction.

In an exemplary embodiment, the second circuit board may further include a flexible film disposed in the folding area, where the flexible film connects the first base substrate and the second base substrate.

In an exemplary embodiment, the first base substrate may include a third driving IC and a first signal wiring which connects the third driving IC and the first circuit board, where the first signal wiring is disposed over the flexible film.

In an exemplary embodiment, the first base substrate may include a third driving IC and a first signal wiring which connects the third driving IC and the first circuit board, where the first signal wiring is disposed over the first circuit board along the second indented portion of the first circuit board.

In an exemplary embodiment, the display device may further include a signal wiring which directly connects the first driving IC and the second driving IC, where the signal wiring is a timing synchronization wiring.

In an exemplary embodiment, the first circuit board may further include a first sub-circuit board on which the first driving IC is disposed and a second sub-circuit board on which the second driving IC is disposed, where the first sub-circuit board and the second sub-circuit board are separated from each other with the folding area interposed between the first sub-circuit board and the second sub-circuit board.

In an exemplary embodiment, the first circuit board may further include a first edge attached to the display panel and a second edge facing the first edge and an indented portion is recessed from the second edge of the first circuit board.

In an exemplary embodiment, a plurality of folding holes may be defined in the first circuit board between the indented portion and the first edge of the first circuit board in the folding area, where the folding holes pass through the first circuit board in the thickness direction.

In an exemplary embodiment, the display module may further include a first surface on which the first circuit board is disposed and a second surface which is located opposite the first surface, where the first unfolding area of the first surface of the display module and the second unfolding area of the first surface of the display module face each other with respect to the folding area of the first surface.

In an exemplary embodiment, a first area of the first circuit board which overlaps the first unfolding area may have a greater width than a second area of the first circuit board which overlaps the second unfolding area, and a distance from the folding area to the first driving IC is greater than a distance from the folding area to the second driving IC.

An exemplary embodiment of the invention provides a display device. The display device includes a folding area, a first unfolding area located on a side of the folding area, and a second unfolding area located on a second side of the folding area. The display device further includes a display module which includes a display panel, and a first circuit board which is disposed under the display module and includes a first edge attached to the display panel where a first indented portion is recessed from the first edge of the first circuit board in the folding area.

In an exemplary embodiment, the display device may further include a second circuit board which includes a first base substrate attached to the first unfolding area of a second edge facing the first edge of the first circuit board and a second base substrate attached to the second unfolding area of the second edge.

In an exemplary embodiment, a second indented portion may be recessed from the second edge of the first circuit board in the folding area.

In an exemplary embodiment, a plurality of folding holes may be defined in the first circuit board between the first indented portion and the second indented portion in the folding area, where the folding holes pass through the first circuit board in a thickness direction.

In an exemplary embodiment, the display module may further include a first surface on which the first circuit board is disposed and a second surface which is located opposite the first surface, where the first unfolding area of the second surface of the display module and the second unfolding area of the second surface of the display module face each other with respect to the folding area of the second surface.

An exemplary embodiment of the invention provides a display device including a folding area, a first unfolding area located on a side of the folding area, and a second unfolding area located on a second side of the folding area. The display device includes a display module which includes a display panel, and a first circuit board which is attached to the display panel and disposed under the display module, where the first circuit board includes a base film, a first driving IC disposed in the first unfolding area, and a second driving IC disposed in the second unfolding area, where the first driving IC and the second driving IC are disposed inside the first circuit board, and a surface of the first driving IC and a surface of the second driving IC are lower than a surface of the base film.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
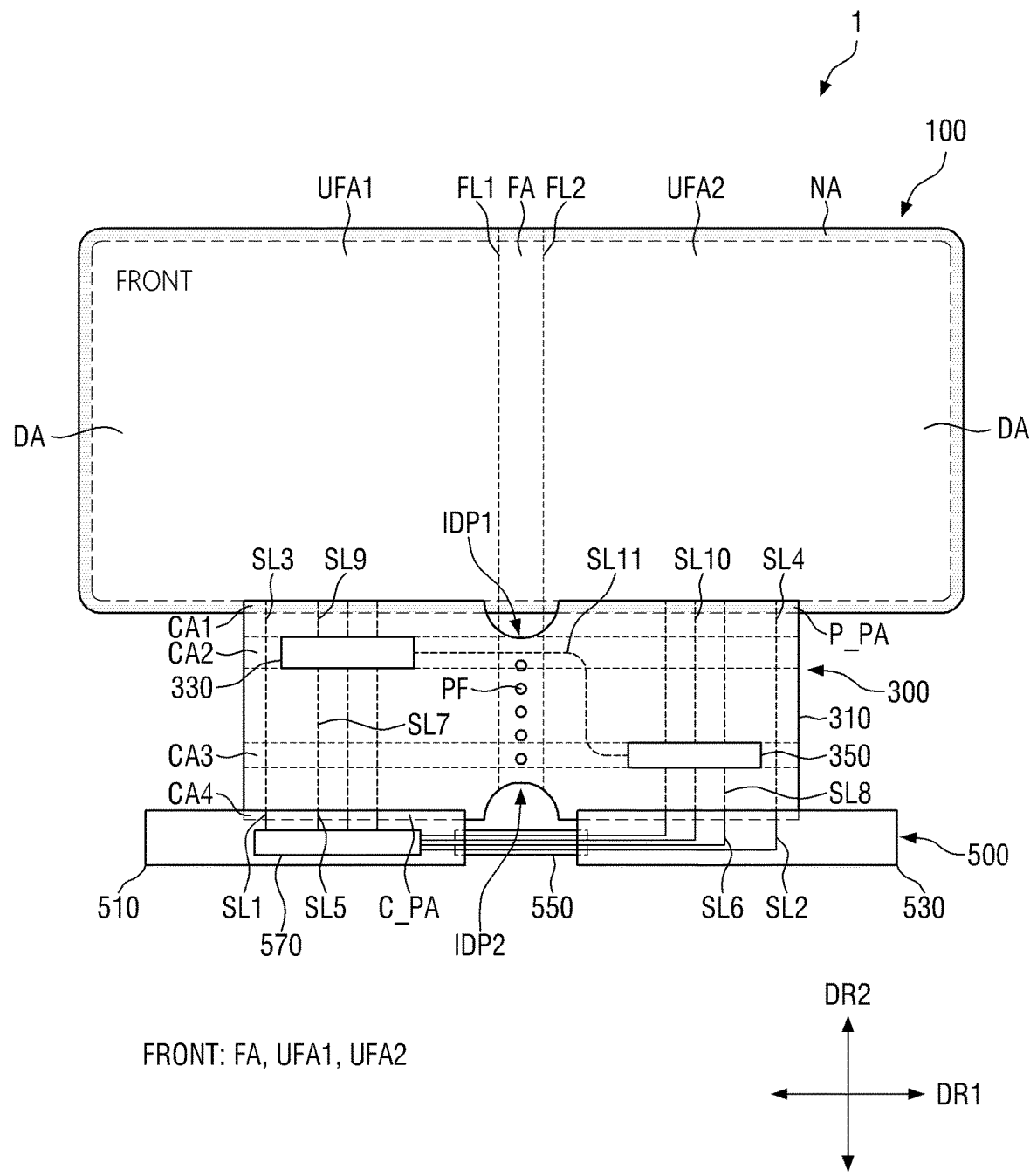
FIG. 1 is a plan view of an exemplary embodiment of a display device.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
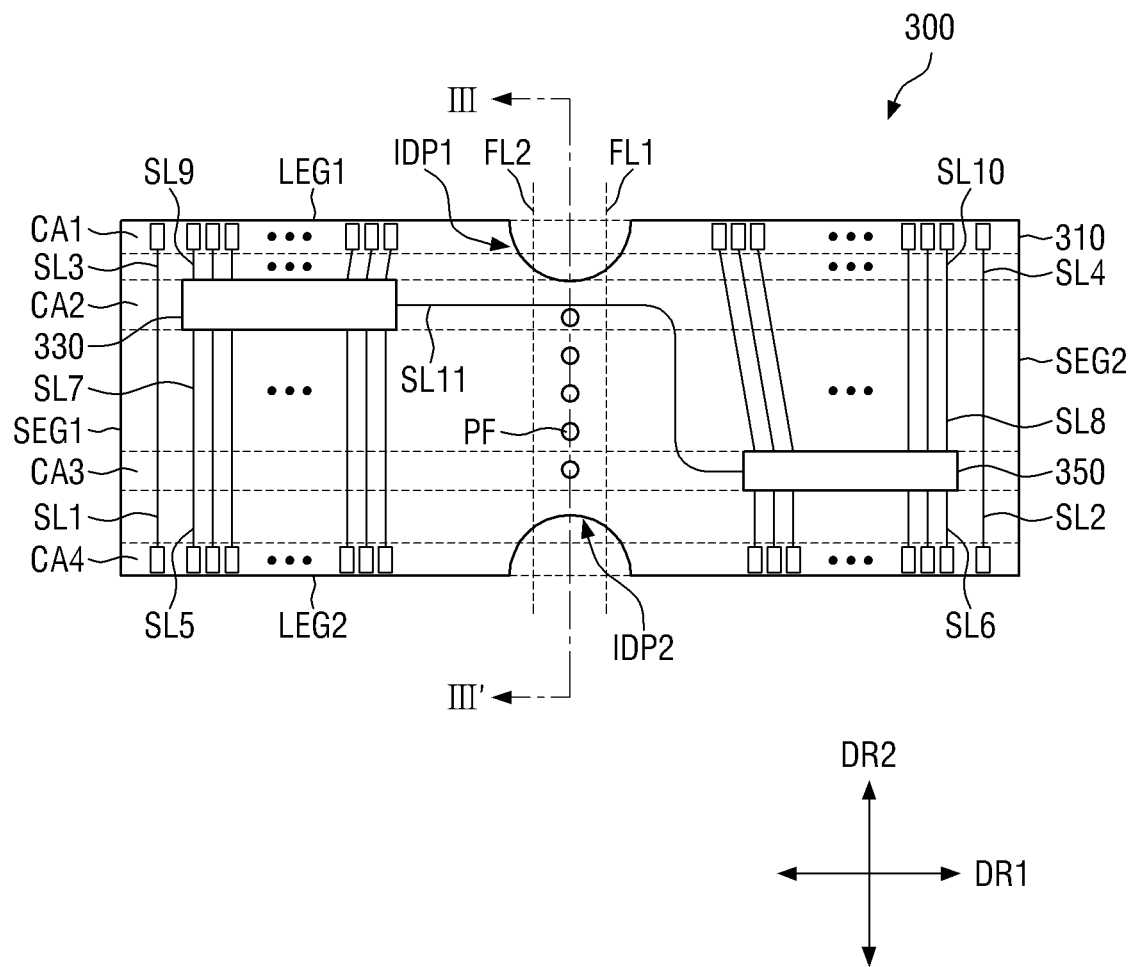
FIG. 2 is a plan view of an exemplary embodiment of a first circuit board.
Figure 3:
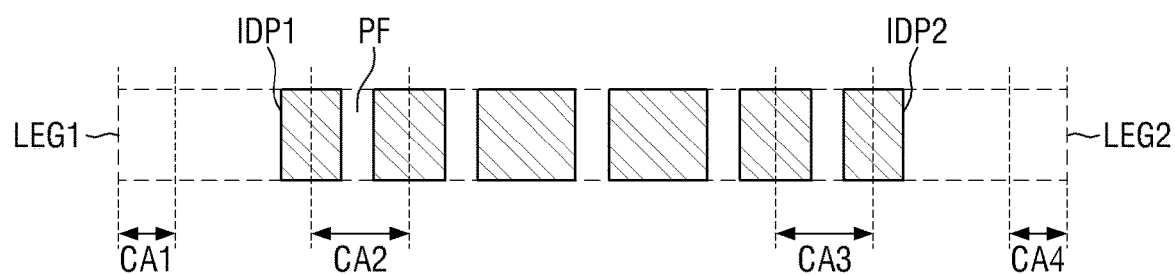
FIG. 3 is a cross-sectional view taken along line of FIG. 2.
Figure 3:
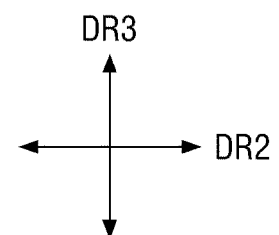
Figure 4:
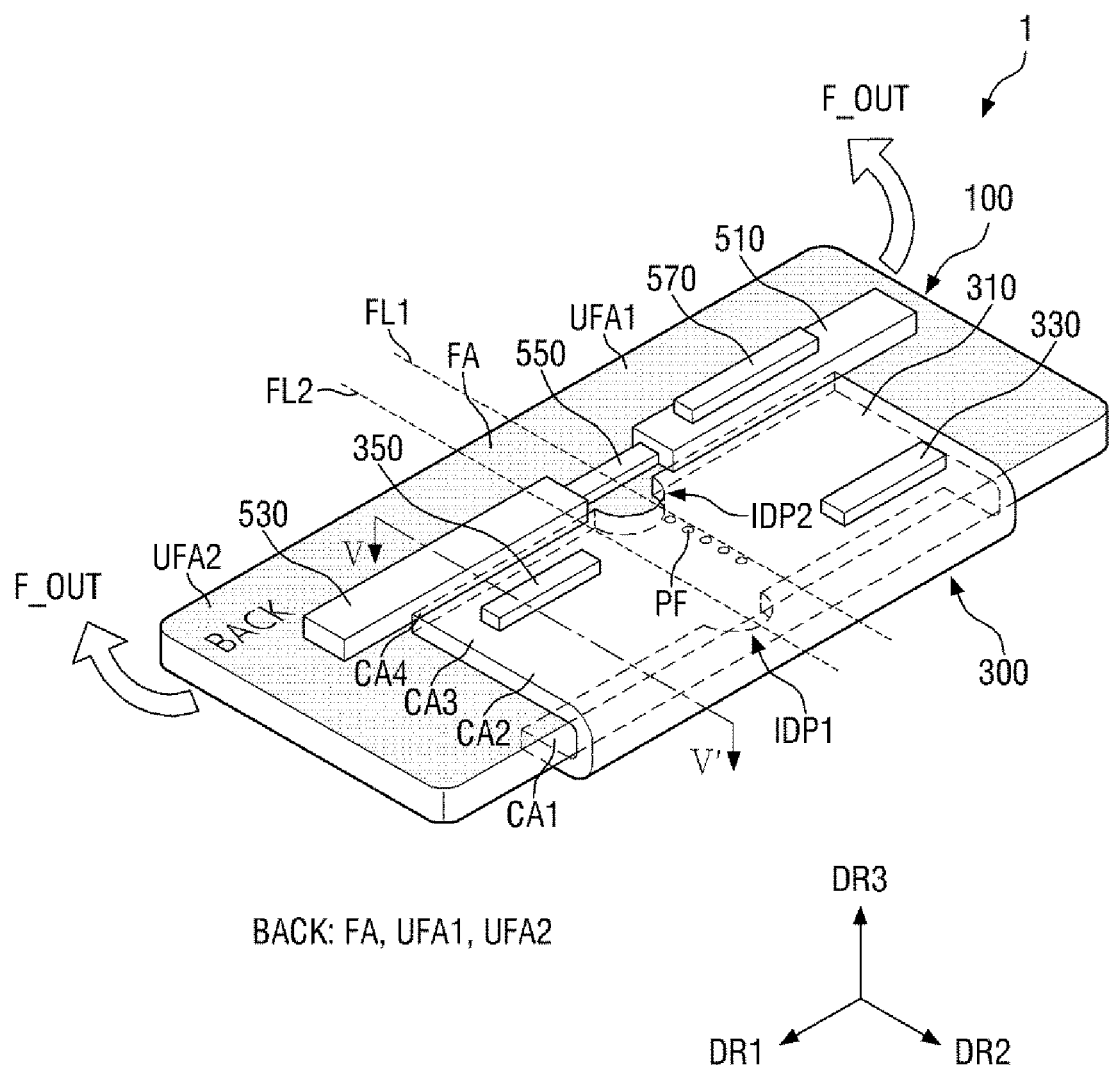
FIG. 4 is a perspective view of the exemplary embodiment of the display device.
Figure 5:
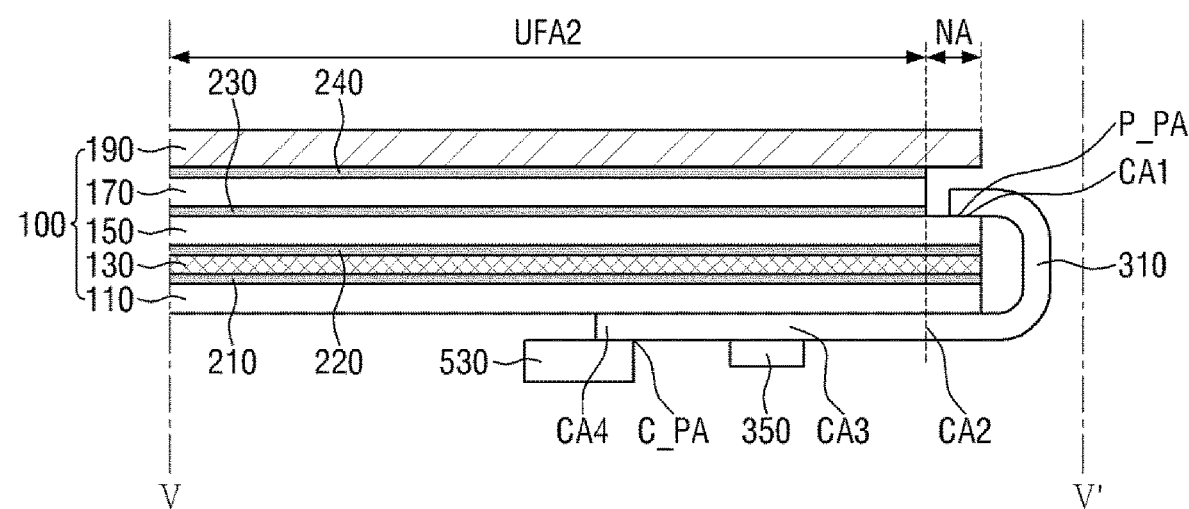
FIG. 5 is a cross-sectional view taken along line V-V' of FIG. 4.
Figure 5:
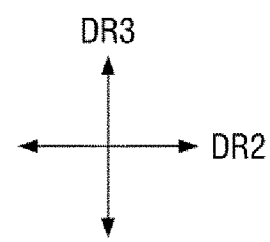
Figure 6:
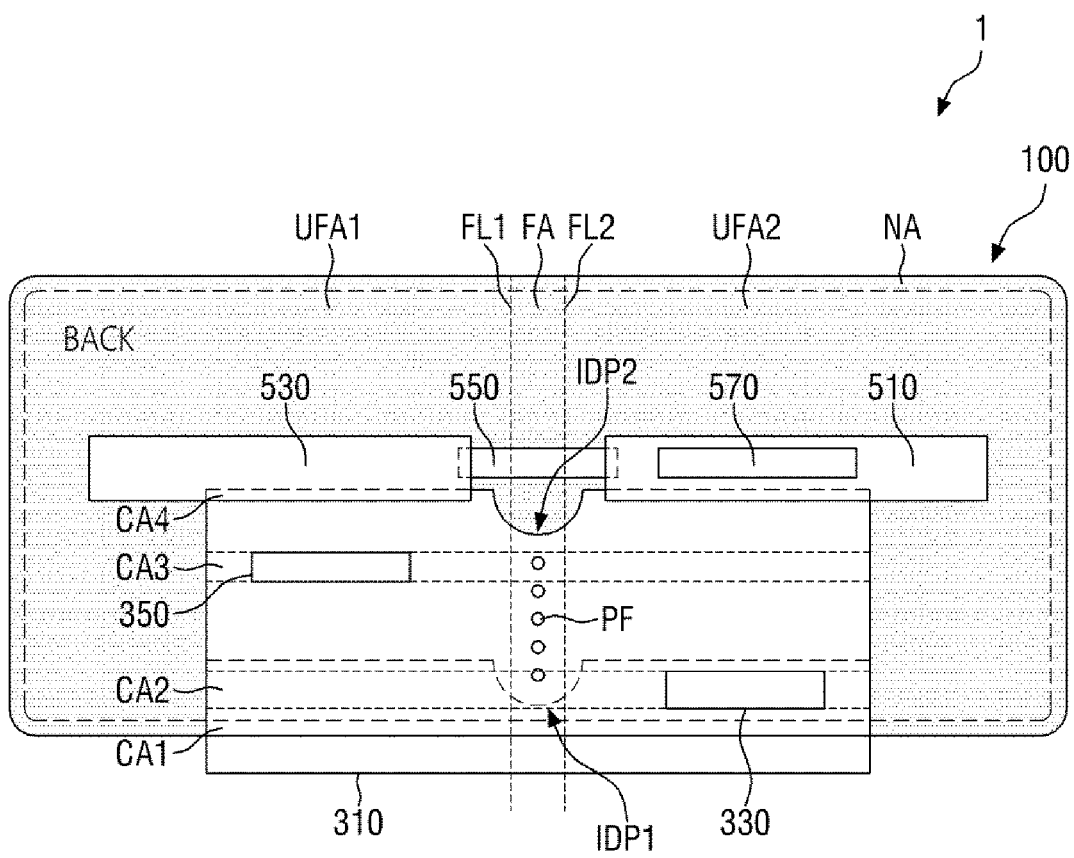
FIG. 6 is a plan view of an exemplary embodiment of a back surface of the display device.

FIG. 1 is a plan view of an exemplary embodiment of a display device 1. FIG. 2 is a plan view of an exemplary embodiment of a first circuit board 300. FIG. 3 is a cross-sectional view taken along line of FIG. 2. FIG. 4 is a perspective view of the exemplary embodiment of the display device 1. FIG. 5 is a cross-sectional view taken along line V-V' of FIG. 4. FIG. 6 is a plan view of a back surface of the exemplary embodiment of the display device 1. FIG. 1 illustrates a front surface of the display device 1 of FIG. 1.

Referring to FIGS. 1 through 6, the display device 1 is a device for displaying moving images or still images. The display device 1 may be used as a display screen in portable electronic devices such as a mobile phone, a smartphone, a tablet personal computer ("PC"), a smart watch, a watch phone, a mobile communication terminal, an electronic notebook, an electronic book, a portable multimedia, play ("PMP"), navigation system and a ultra-mobile PC ("UMPC"), as well as in various products such as a television, a notebook computer, a monitor, a billboard and the Internet of things ("IoT").

The display device 1 may be a foldable display device. As used herein, the term "foldable" may refer to a flexible state, specifically, may include bendable, rollable, etc. Further, the term "foldable" should be interpreted to include all of "partially" foldable indicating that a folding area to be described later is applied to only a part of the display device 1 instead of completely crossing the display device 1 in order to apply a foldable function to only a part of the display device 1, "entirely" foldable indicating that the folding area completely crosses the display device 1 in order to apply the foldable function to the whole of the display device 1, "in" foldable indicating that a display surface is covered when the display device 1 is folded, and "out" foldable indicating that the display surface faces outward when the display device 1 is folded.

The display device 1 may include a display area DA and a non-display area NA disposed around the display area DA. The display area DA is an area where a screen is displayed, and the non-display area NA is an area where no screen is displayed. The display area DA may be located in a central part of the display device 1. A direction that the display area DA faces when the display device 1 is unfolded will be defined as a front side, and a side opposite the front side will be defined as a back side.

In an exemplary embodiment, the display device 1 may have a substantially rectangular shape with rounded corners in a plan view, for example. The display device 1 may include four edges. That is, as illustrated in FIG. 1, the display device 1 may include long edges extending along a first direction DR1 and short edges extending along a second direction DR2. However, the invention is not limited thereto, and other shapes such as a square and a circle may also be applied as the planar shape of the display device 1.

The front surface of the display device 1 may include a folding area FA, a first unfolding area UFA1 located on a side (e.g., left side in FIG. 1) of the folding area FA, and a second unfolding area UFA2 located on the other side (e.g., right side in FIG. 1) of the folding area FA. The folding area FA may be an area where the display device 1 is folded or bent with a predetermined curvature in a folding direction, and the unfolding areas UFA1 and UFA2 may be areas that are not folded, unlike the folding area FA. However, the invention is not limited to this case, and each of the unfolding areas UFA1 and UFA2 may also be partially folded in the folding direction.

In an exemplary embodiment, the folding area FA may be located between folding lines FL1 and FL2 crossing the long edges as illustrated in FIG. 1, for example. The first unfolding area UFA1 may be located on a side of the folding area FA in the first direction DR1, and the second unfolding area UFA2 may be spaced apart from the first unfolding area UFA1 with the folding area FA interposed between them and may be located on the other side of the folding area FA in the first direction DR1. The display area DA of the folding area FA, the first unfolding area UFA1 and the second unfolding area UFA2 may be an area where a screen is displayed, and the non-display area NA of the folding area FA, the first unfolding area UFA1 and the second unfolding area UFA2 may be an area where no screen is displayed.

In some exemplary embodiments, the folding area FA may be an area where the display device 1 is bent in the folding direction. In this case, the folding area FA may be bent along the folding direction with reference to a folding axis located between the folding lines FL1 and FL2.

As the folding area FA of the display device 1 is folded, the first unfolding area UFA1 and the second unfolding area UFA2 may face directions other than the front side. That is, when the display device 1 is unfolded, the folding area FA, the first unfolding area UFA1 and the second unfolding area UFA2 may face the same direction, e.g., the front side. When the display device 1 is folded by an out-folding force F_OUT of FIG. 4, the first unfolding area UFA1 and the second unfolding area UFA2 may face different directions from each other. That is, when the display device 1 is folded, a screen may be displayed in a plurality of directions.

The display device 1 includes a display module 100, the first circuit board 300 attached to the display module 100, and a second circuit board 500 attached to the first circuit board 300. The display module 100 may include a plurality of stacked panels and/or members as illustrated in FIG. 5. The display module 100 may include a display panel 150, a lower cover panel 130 disposed under the display panel 150, an upper cover member 170 disposed on the display panel 150, and a window 190 disposed on the upper cover member 170.

A support plate 110 may be disposed on a bottom surface of the display module 100.

The support plate 110 may prevent the display panel 150 from being bent by an external force or may reduce the degree to which the display panel 150 is bent (e.g., a bending angle, a bending radius of curvature, etc.). That is, the support plate 110 may keep the display panel 150 relatively flat against an external force.

The support plate 110 may include a rigid or semi-rigid material. In an exemplary embodiment, the support plate 110 may include a metal material such as stainless steel ("SUS") or aluminum or a polymer such as polymethyl metacrylate ("PMMA"), polycarbonate ("PC"), polyvinylalcohol ("PVA"), acrylonitrile-butadiene-styrene ("ABS") or polyethylene terephthalate ("PET").

Although not illustrated, the support plate 110 may be disposed in the unfolding areas UFA1 and UFA2 of the display device 1. In an exemplary embodiment, the support plate 110 may include two sub-support plates which are not disposed in the folding area FA of the display device 1 and are spaced apart from each other with the folding area FA interposed between them, for example.

Unless otherwise defined, the terms "above", "top" and "upper surface" indicate a display surface side of the display panel 150, and the terms "below," "bottom" and "lower surface" indicate an opposite side of the display panel 150 from the display surface side.

The lower cover panel 130 may be disposed on the support plate 110. The lower cover panel 130 may include at least one functional layer. The functional layer may be a layer performing a buffering function, a heat dissipating function, an electromagnetic wave shielding function, a grounding function, a strength enhancing function, a support function, a pressure sensing function a digitizing function, etc. The lower cover panel 130 may be a single layer. However, the lower cover panel 130 is not limited to a single layer and may also include a stack of different functional layers. The lower cover panel 130 may include, for example, a buffer member. The buffer member may prevent the impact applied from the outside (e.g., from under the lower cover panel 130) from being transmitted to the display panel 150. In an exemplary embodiment, the buffer member may include a foam material such as polyurethane ("PU"), thermoplastic polyurethane ("TPU"), silicon (Si), or polydimethylacrylamide ("PDMA").

The lower cover panel 130 may have lower light transmittance than a plurality of members disposed on the display panel 150 to be described later. That is, layers disposed on the display panel 150 may have relatively high light transmittance to transmit light emitted upward from the display area DA of the display panel 150. The lower cover panel 130 may have relatively low light transmittance to block light emitted downward from the display area DA of the display panel 150.

The display panel 150 may be disposed on the lower cover panel 130.

The display panel 150 may display an image in response to an input data signal. In exemplary embodiments, the display panel 150 may be an organic light emitting display panel, a liquid crystal display panel, a plasma display panel, an electrophoretic display panel, an electrowetting display panel, a quantum-dot light emitting display panel, a micro light emitting diode ("LED") display panel, or the like. In the illustrated exemplary embodiment, an organic light emitting display panel is applied as the display panel 150.

In an exemplary embodiment, the display panel 150 may include a flexible substrate including a flexible polymer material such as polyimide ("PI"). Accordingly, the display panel 150 may be curved, bent, folded, or rolled. The display panel 150 may have substantially the same or similar shape as that of the planar shape of the display device 1.

A plurality of pixels PX may be disposed in the display area DA of the display panel 150. The non-display area NA may include a panel pad area P_PA where a plurality of wiring pads are disposed. The first circuit board 300 to be described later may be attached to the panel pad area P_PA and thus connected to the display panel 150 and may be folded toward a back surface of the display module 100. In addition, the second circuit board 500 to be described later may be folded toward the back surface of the display module 100, like the first circuit board 300, while being attached to the first circuit board 300.

Each of the pixels PX may include a light emitting layer and a circuit layer which controls the amount of light emitted from the light emitting layer. The circuit layer may include a plurality of wirings, a plurality of electrodes, and at least one transistor. The light emitting layer may include an organic light emitting material. The light emitting layer may be sealed by an encapsulation layer. The encapsulation layer may seal the light emitting layer to prevent introduction of moisture from the outside. The encapsulation layer may be composed of a single inorganic layer or a plurality of inorganic layers or may be composed of an inorganic layer and an organic layer stacked alternately.

The upper cover member 170 may be disposed on the display panel 150.

The upper cover member 170 may overlap the display panel 150 to cover part or all of the display area DA of the display panel 150. In addition, the upper cover member 170 may cover the non-display area NA of the display panel 150 or both the display area DA and the non-display area NA. The upper cover member 170 may include at least one of various functional members. In an exemplary embodiment, the upper cover member 170 may include a polarizing plate or member having a polarizing function, a touch panel or module having a touch sensing function, a color filter, a color conversion film, an optical film, an antireflection member, and/or a biometric information recognition member such as a fingerprint recognition sensor, for example.

The window 190 may be disposed on the upper cover member 170.

The window 190 protects the members 110, 130, 150 and 170 disposed under the window 190 by covering the members 110, 130, 150 and 170. In an exemplary embodiment, the window 190 may include glass, quartz, transparent plastic, etc.

The display module 100 may further include a plurality of bonding layers disposed between the members 110, 130, 150, 170 and 190 to bond the members 110, 130, 150, 170 and 190. A first bonding layer 210 may be disposed between the support plate 110 and the lower cover panel 130 to bond them together. A second bonding layer 220 may be disposed between the lower cover panel 130 and the display panel 150 to bond them together. A third bonding layer 230 may be disposed between the display panel 150 and the upper cover member 170 to bond them together. A fourth bonding layer 240 may be disposed between the upper cover member 170 and the window 190 to bond them together.

In an exemplary embodiment, each of the bonding layers 210 through 240 is a layer whose upper and lower surfaces have adhesive properties and may be, for example, a pressure sensitive adhesive ("PSA"), an optical clear adhesive ("OCA"), or an optical clear resin ("OCR"). Each of the bonding layers 210 through 240 may include acrylic resin or silicone resin. In an exemplary embodiment, each of the bonding layers 210 through 240 may have an elongation of about 100 percent (%) to about 1,000%, for example.

The first circuit board 300 may be attached to the panel pad area P_PA of the display panel 150. Specifically, the first circuit board 300 may be attached to the wiring pads of the display panel 150. The first circuit board 300 may include a printed base film 310, driving integrated circuits ("ICs") 330 and 350 disposed on the printed base film 310, and a plurality of signal wirings SL3, SL4 and SL7 through SL11 disposed on the printed base film 310. The first circuit board 300 may be a flexible printed circuit board ("FPCB") that may be folded toward the front surface and/or the back surface of the display module 100.

As illustrated in FIGS. 1 and 2, each of the driving ICs 330 and 350 may be a driving chip. In an exemplary embodiment, the driving chip may be, for example, a chip on film ("COF").

The first circuit board 300 may include a plurality of circuit areas CA1 through CA4. A first circuit area CA1 may be an area attached to the panel pad area P_PA of the display panel 150, a second circuit area CA2 may be an area in which a first driving IC 330 is disposed, a third circuit area CA3 may be an area in which a second IC 350 is disposed, and a fourth circuit area CA4 may be an area to which the second circuit board 500 is attached. The second circuit area CA2 may be disposed between the third circuit area CA3 and the first circuit area CA1, and the third circuit area CA3 may be disposed between the second circuit area CA2 and the fourth circuit area CA4.

The first circuit board 300 may be substantially rectangular in a plan view. That is, the first circuit board 300 may include long edges LEG1 and LEG2 and short edges SEG1 and SEG2. A first long edge LEG1 of the first circuit board 300 may be disposed on the first circuit area CA1 and may be attached to the panel pad area P_PA of the display panel 150. A second long edge LEG2 of the first circuit board 300 may be disposed on the fourth circuit area CA4 and may be attached to the second circuit board 500. A first short edge SEG1 of the first circuit board 300 may be disposed on a left side in the plane of FIG. 1, and the second short edge SEG2 of the first circuit board 300 may be disposed on a right side in the plane of FIG. 1.

The printed base film 310 may include a flexible material. In an exemplary embodiment, the flexible material may be, for example, polyethersulphone ("PES"), polyacrylate ("PA"), polyarylate ("PAR"), polyetherimide ("PEI"), polyethylene naphthalate ("PEN"), polyethylene terepthalate ("PET"), polyphenylene sulfide ("PPS"), polyallylate, polyimide ("PI"), polycarbonate ("PC") cellulose triacetate ("CAT"), cellulose acetate propionate: ("CAP"), or a combination of the same.

The driving ICs 330 and 350 output signals and voltages for driving the display panel 150. Each of the driving ICs 330 and 350 may include a data driver and a timing controller. The data driver of each of the driving ICs 330 and 350 may output a data signal for driving each pixel PX of the display panel 150, and the timing controller of each of the driving ICs 330 and 350 may control the timing of the data signals output from the data driver.

In a state where the first circuit board 300 is folded toward the back surface of the display module 100, the first driving IC 330 may be disposed in the first unfolding area UFA1 of the display device 1, and the second driving IC 350 may be disposed in the second unfolding area UFA2 of the display device 1.

Each of the driving ICs 330 and 350 may be disposed on a surface of the base film 310 which faces a direction the back surface of the display device 1 faces during bending, as illustrated in FIGS. 1 and 4.

As illustrated in FIGS. 1 and 4, when the display device 1 is unfolded, the first driving IC 330 and the second driving IC 350 may not overlap each other in a direction from the first unfolding area UFA1 toward the folding area FA, for example, in the first direction DR1. Therefore, when the display device 1 is folded, the first driving IC 330 and the second driving IC 350 may be prevented from overlapping each other in a thickness direction. In an exemplary embodiment, in a state where the first circuit board 300 is unfolded and a state where the first circuit board 300 is folded toward the back surface of the display module 100, the first driving IC 330 may be disposed closer to the panel pad area P_PA of the display panel 150 than the second driving IC 350, for example. That is, the first driving IC 330 may be disposed closer to the first long edge LEG1 than the second driving IC 350. Therefore, when the display device 1 is out-folded, a direct contact between the driving ICs 330 and 350 may be prevented. This will be described later in detail.

Referring to FIG. 6, when the display device 1 is unfolded, the first driving IC 330 and the second driving IC 350 may not overlap each other in the direction from the first unfolding area UFA1 toward the folding area FA, for example, in the first direction DR1. Therefore, when the display device 1 is folded, the first driving IC 330 and the second driving IC 350 may be prevented from overlapping each other in the thickness direction. In an exemplary embodiment, when the first circuit board 300 is folded toward the back surface of the display module 100, the second driving IC 350 may be located closer to the second circuit board 500 than the first driving IC 330, for example. In other words, the first driving IC 330 may be located further from the second circuit board 500 than the second driving IC 350 is from the second circuit board 500.

Although the first driving IC 330 is disposed in the first unfolding area UFA1 and the second driving IC 350 is disposed in the second unfolding area UFA2 in FIGS. 1 and 2, the invention is not limited to this case, and the opposite case is also possible. In addition, although the first driving IC 330 is closer to the panel pad area P_PA of the display panel 150 than the second driving IC 350 is to the panel pad area P_PA, the invention is not limited to this case, and the opposite case is also possible.

The signal wirings SL3, SL4 and SL7 through SL10 of the first circuit board 300 may be disposed in the unfolding areas UFA1 and UFA2 in a state where the first circuit board 300 is folded toward the back surface of the display module 100, but may not be disposed in the folding area FA. An eleventh signal wiring SL11 may pass through the folding area FA.

A third signal wiring SL3 may connect a first signal wiring SL1 of the second circuit board 500 to be described later to the display panel 150, and a fourth signal wiring SL4 may connect a second signal wiring SL2 of the second circuit board 500 to the display panel 150. As illustrated in FIG. 2, the third signal wiring SL3 may be disposed adjacent to the first short edge SEG1, and the fourth signal wiring SL4 may be disposed adjacent to the second short edge SEG2.

A seventh signal wiring SL7 may connect a fifth signal wiring SL5 of the second circuit board 500 to be described later to the first driving IC 330, an eighth signal wiring SL8 may connect a sixth signal wiring SL6 of the second circuit board 500 to be described later to the second driving IC 350, a ninth signal wiring SL9 may connect the first driving IC 330 to the display panel 150, a tenth signal wiring SL10 may connect the second driving IC 350 to the display panel 150, and the eleventh signal wiring SL11 may electrically connect the first driving IC 330 and the second driving IC 350. The eleventh signal wiring SL11 may be a timing synchronization wiring which synchronizes each timing signal of the timing controller of each of the driving ICs 330 and 350.

In a state where the first circuit board 300 is folded toward the back surface of the display module 100, the third signal wiring SL3, the seventh signal wiring SL7 and the ninth signal wiring SL9 may be disposed in the first unfolding area UFA1, the fourth signal wiring SL4, the eighth signal wiring SL8 and the tenth signal wiring SL10 may be disposed in the second unfolding area UFA2, and the eleventh signal wiring SL11 may be disposed over the first unfolding area UFA1, the folding area FA and the second unfolding area UFA2.

Indented portions IDP1 and IDP2 may be defined in the long edges LEG1 and LEG2 of the first circuit board 300, respectively. That is, a first indented portion IDP1 recessed into the first circuit board 300 may be defined in the first long edge LEG1 of the first circuit board 300 in the folding area FA as compared with the first long edge LEG1 of the first circuit board 300 in the unfolding areas UFA1 and UFA2, and a second indented portion IDP2 recessed into the first circuit board 300 may be defined in the second long edge LEG2 of the first circuit board 300 in the folding area FA as compared with the second long edge LEG2 of the first circuit board 300 in the unfolding areas UFA1 and UFA2. The first indented portion IDP1 may be shaped like a trench recessed from the first long edge LEG1 of the first circuit board 300, and the second indented portion IDP2 may be shaped like a trench recessed from the second long edge LEG2 of the first circuit board 300.

In FIGS. 1 and 2, the first indented portion IDP1 is defined in the first circuit area CA1 of the first circuit board 300, and the second indented portion IDP2 is disposed over the fourth circuit area CA4. However, the first indented portion IDP1 may also be defined in the second circuit area CA2 of the first circuit board 300, and the second indented portion IDP2 may also be defined in the third circuit area CA3 of the first circuit board 300.

Further, a plurality of folding holes PF may be defined in the first circuit board 300 between the first long edge LEG1 and the second long edge LEG2 in the folding area FA in a plan view. The folding holes PF may be through holes passing through the first circuit board 300 in the thickness direction. Each of the folding holes PF may be disposed in the first circuit board 300 and may be surrounded by the constituent material of the first circuit board 300 in a plan view. As illustrated in FIGS. 1 and 2, the folding holes PF may be disposed over the second circuit area CA2 and the third circuit area CA3 of the first circuit board 300.

Although the number of the folding holes PF is five in FIGS. 1 and 2, the number of the folding holes PF is not limited to five and may also be one, two to four, or six or more. In addition, although the folding holes PF are circular in a plan view, the planar shape of each of the folding holes PF is not limited to the circular shape and may also be a triangular shape, a quadrilateral shape, an elliptical shape, or other various shapes.

After the first circuit board 300 is folded toward the back surface of the display module 100, it may be folded together with the display module 100 along the folding direction as will be described later. The indented portions IDP1 and IDP2 and the folding holes PF of the first circuit board 300 described above may increase the flexibility of the first circuit board 300 during the folding of the first circuit board 300.

The second circuit board 500 may include first and second base substrates 510 and 530, a third driving IC 570 disposed on the first base substrate 510, a flexible film 550 disposed on the base substrates 510 and 530, and a plurality of signal wirings SL1, SL2, SL5 and SL6.

The first base substrate 510 and the second base substrate 530 may be spaced apart from each other. In a state where the second circuit board 500 is folded toward the back surface of the display module 100, the first base substrate 510 may be disposed in the first unfolding area UFA1 of the display device 1, and the second base substrate 530 may be disposed in the second unfolding area UFA2 of the display device 1. That is, the first base substrate 510 and the second base substrate 530 may be spaced apart from each other with the folding area FA interposed between them.

Each of the base substrates 510 and 530 may include a circuit pad area C_PA attached to the first circuit board 300.

Since the second circuit board 500 includes the base substrates 510 and 530 spaced apart from each other, the flexibility of the second circuit board 500 may be secured in the folding area FA when the second circuit board 500 is folded together with the display module 100.

The third driving IC 570 may include a source/drain IC and a voltage driver. The source/drain IC may generate and transmit the data signal to data driving ICs of the first driving IC 330 and the second driving IC 350, and the voltage driver may apply a high-potential voltage and/or a low-potential voltage to the display panel 150.

Although the third driving IC 570 is disposed on the first base substrate 510 in FIG. 1, the invention is not limited to this case. The third driving IC 570 may also be disposed on the second base substrate 530.

The first signal wiring SL1 may connect the third driving IC 570 and the first circuit board 300. Although one first signal wiring SL1 and one second signal wiring SL2 are illustrated in FIGS. 1 and 2, each of the first signal wiring SL1 and the second signal wiring SL2 may also be provided in plural numbers.

The first signal wiring SL1 may deliver a voltage generated by the voltage driver of the third driving IC 570 to the third signal wiring SL3 of the first circuit board 300, although the invention is not limited to this case. The third signal wiring SL3 may deliver the voltage applied from the first signal wiring SL1 to a high-potential voltage wiring and/or a low-potential voltage wiring of the display panel 150.

The second signal wiring SL2 may deliver a voltage generated by the voltage driver of the third driving IC 570 to the first circuit board 300. That is, the second signal wiring SL2 may deliver the voltage generated by the voltage driver to the fourth signal wiring SL4 of the first circuit board 300. The fourth signal wiring SL4 may deliver the voltage applied from the second signal wiring SL2 to a high-potential voltage wiring and/or a low-potential voltage wiring of the display panel 150.

The second signal wiring SL2 may extend from the third driving IC 570 onto the second base substrate 530 via the flexible film 550 to be described later. That is, the second signal wiring SL2 may be disposed over the base substrates 510 and 530 and the flexible film 550.

The fifth signal wiring SL5 may connect the third driving IC 570 and the first circuit board 300. In an exemplary embodiment, the fifth signal wiring SL5 may deliver the data signal generated by the source/drain IC of the third driving IC 570 to the first circuit board 300 through the seventh signal wiring SL7 of the first circuit board 300, for example.

The sixth signal wiring SL6, like the fifth signal wiring SL5, may connect the third driving IC 570 and the first circuit board 300. In an exemplary embodiment, the sixth signal wiring SL6 may deliver the data signal generated by the source/drain IC of the third driving IC 570 to the first circuit board 300 through the eighth signal wiring SL8 of the first circuit board 300, for example.

The sixth signal wiring SL6, like the second signal wiring SL2, may extend from the third driving IC 570 onto the second base substrate 530 via the flexible film 550 to be described later. That is, the sixth signal wiring SL6 may be disposed over the base substrates 510 and 530 and the flexible film 550.

The flexible films 550 may physically connect the first base substrate 510 and the second base substrate 530. The flexible film 550 may be disposed in the folding area FA of the display device 1.

Although the flexible film 550 is attached to each of the base substrates 510 and 530 while partially overlapping each of the base substrates 510 and 530, the invention is not limited to this case. The flexible film 550 may also be connected to each of the base substrates 510 and 530 by a connection portion.

The second signal wiring SL2 and the sixth signal wiring SL6 of the second circuit board 500 may be disposed on the flexible film 550 as described above.

The flexible film 550 may include a more flexible material than that of the base substrates 510 and 530. In an exemplary embodiment, the flexible film 550 may include at least one of polyethersulphone ("PES"), polyacrylate ("PA"), polyarylate ("PAR"), polyetherimide ("PEI"), polyethylene naphthalate ("PEN"), polyethylene terephthalate (PET), polyphenylene sulfide ("PPS"), polyallylate, polyimide ("PI"), polycarbonate ("PC"), cellulose triacetate ("CAT"), cellulose acetate propionate ("CAP"), and combinations of the same, for example.

Since the flexible film 550 includes the above flexible material, the flexibility of the second circuit board 500 may be secured in the folding area FA when the second circuit board 500 is folded together with the display module 100.

Figure 7:
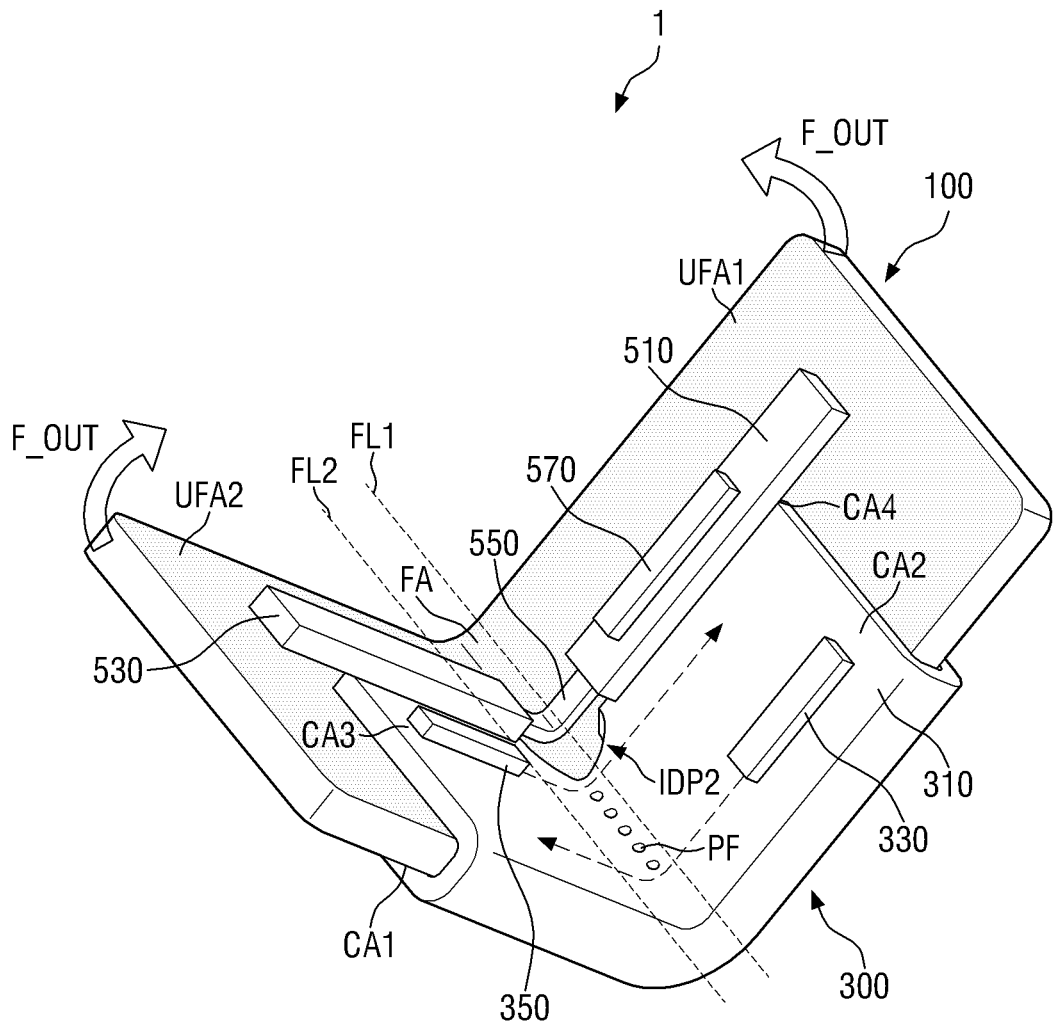
FIG. 7 is a perspective view illustrating a folded state of the exemplary embodiment of the display device.

FIG. 7 is a perspective view illustrating a folded state of the exemplary embodiment of the display device 1.

Referring to FIG. 7, when the out-folding force F_OUT acts on the display device 1 in a direction toward the back surface of the display device 1, the display module 100, the first circuit board 300, and the second circuit board 500 may be folded with reference to the folding area FA.

More specifically, the display module 100 may include a first surface corresponding to the front surface of the display device 1 and a second surface corresponding to the back surface of the display device 1. When the out-folding force F_OUT acts on the display device 1, areas of the second surface of the display module 100 may face each other. That is, the first unfolding area UFA1 and the second unfolding area UFA2 of the second surface of the display module 100 may face each other.

When the display module 100 is folded, the first circuit board 300 and the second circuit board 500 are also folded together with the display module 100. Here, the first indented portion IDP1 and the second indented portion IDP2 defined in the folding area FA of the first circuit board 300 as described above may ensure the flexibility of the first circuit board 300 during folding in an area where the first circuit board 300 is attached to each of the display panel 150 and the second circuit board 500.

Further, the folding holes PF defined in the folding area FA of the first circuit board 300 may ensure the flexibility of the first circuit board 300 during folding, like the indented portions IDP1 and IDP2.

When the out-folding force F_OUT acts on the display device 1, areas of the surface of the first circuit board 300 on which the driving ICs 330 and 350 are disposed may face each other. That is, the first unfolding area UFA1 and the second unfolding area UFA2 of the surface of the first circuit board 300 may face each other. In this case, the first driving IC 330 disposed in the first unfolding area UFA1 and the second driving IC 350 disposed in the second unfolding area UFA2 may physically contact each other.

However, since the first driving IC 330 and the second driving IC 350 of the first circuit board 300 of the display device 1 in the exemplary embodiment are disposed not to overlap each other in the direction from the first unfolding area UFA1 toward the folding area FA, for example, in the first direction DR1, when the display device 1 is out-folded, the first driving IC 330 and the second driving IC 350 may not overlap each other in the thickness direction. This prevents a direct contact between the driving ICs 330 and 350, thereby preventing the driving ICs 330 and 350 from being physically damaged.

Hereinafter, other exemplary embodiments will be described. In the following exemplary embodiments, the same elements s those of the above-described embodiment will be indicated by the same reference numerals, and a redundant description thereof will be omitted or given briefly.

Figure 8:
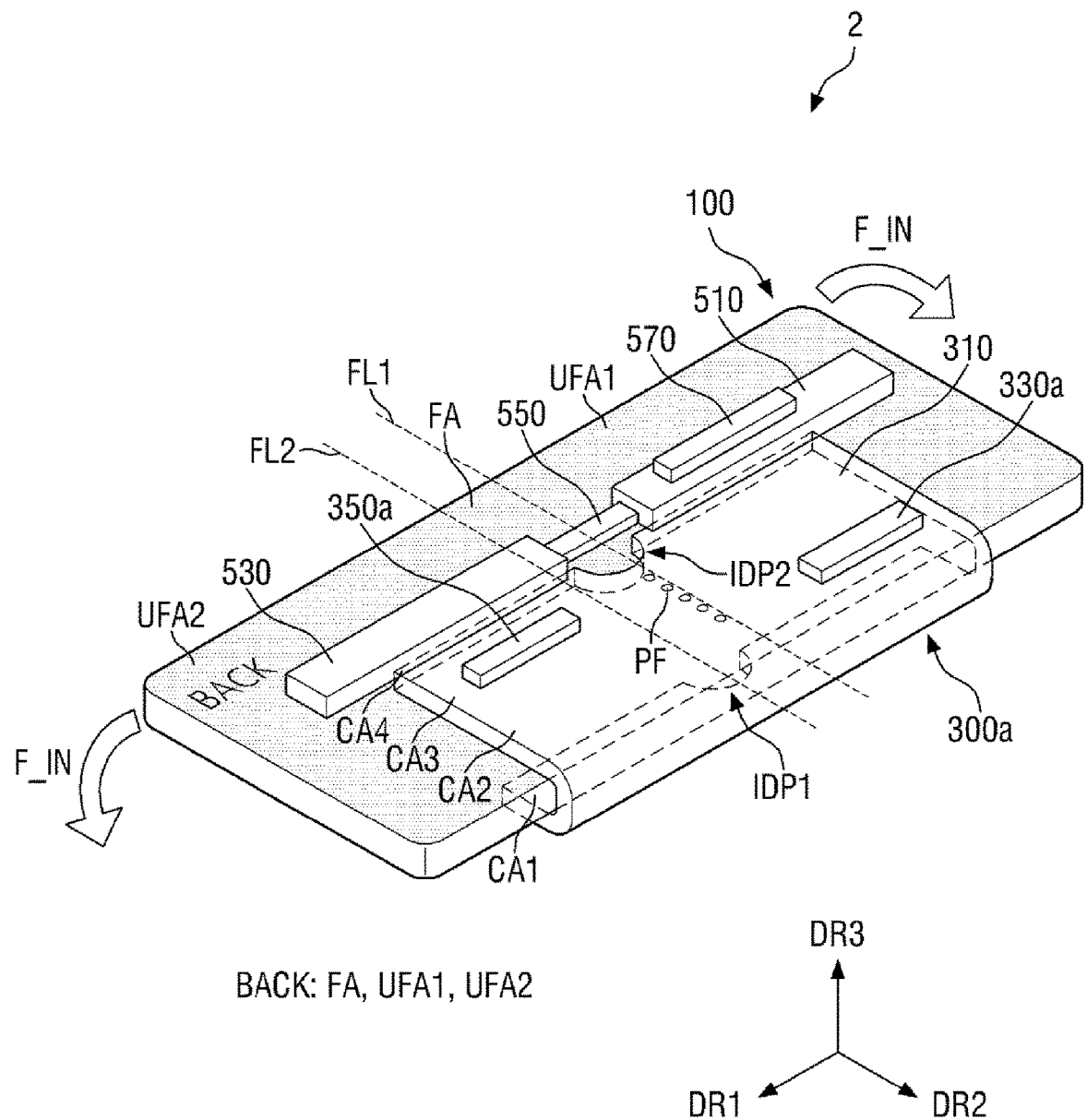
FIG. 8 is a perspective view of an exemplary embodiment of a display device.
Figure 9:
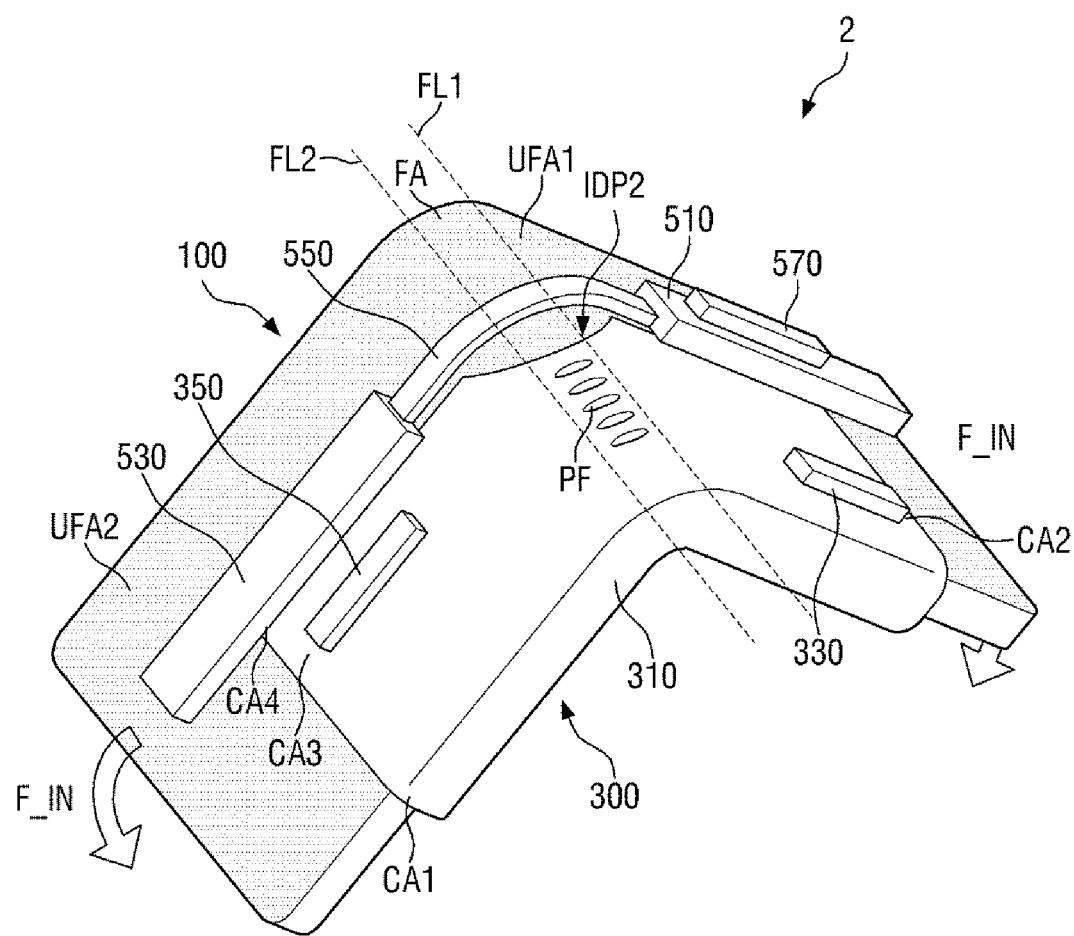
FIG. 9 is a perspective view illustrating a folded state of the exemplary embodiment of the display device of FIG. 8.

FIG. 8 is a perspective view of an exemplary embodiment of a display device 2. FIG. 9 is a perspective view illustrating a folded state of the exemplary embodiment of the display device 2.

Referring to FIGS. 8 and 9, the display device 2 in the current exemplary embodiment is different from the display device 1 in the exemplary embodiment of FIGS. 1 through 7 in that it is an "in"-foldable display device. That is, an in-folding force F_IN may act on the display device 2 in the current exemplary embodiment in a direction toward a front surface of the display device 2. Accordingly, a display module 100, a first circuit board 300a, and a second circuit board 500 may be folded with reference to a folding area FA.

More specifically, as described above in FIG. 4, the display module 100 may include a first surface corresponding to the front surface of the display device 2 and a second surface corresponding to a back surface of the display device 2. When the in-folding force F_IN acts on the display device 2, areas of the first surface of the display module 100 may face each other. That is, a first unfolding area UFA1 and a second unfolding area UFA2 of the first surface of the display module 100 may face each other.

When the display module 100 is folded, the first circuit board 300a and the second circuit board 500 are also folded together with the display module 100. Here, a first indented portion IDP1 and a second indented portion IDP2 defined in the folding area FA of the first circuit board 300a as described above may ensure the flexibility of the first circuit board 300a during folding in an area where the first circuit board 300a is attached to each of a display panel 150 and the second circuit board 500. Further, a plurality of folding holes PF defined in the folding area FA of the first circuit board 300a may ensure the flexibility of the first circuit board 300a during folding, like the indented portions IDP1 and IDP2.

When the in-folding force F_IN acts on the display device 2 in the current exemplary embodiment, areas of a surface of the first circuit board 300a on which driving ICs 330a and 350a are disposed may face different directions, unlike the display device 1 in the exemplary embodiment of FIGS. 1 through 7. That is, the first unfolding area UFA1 and the second unfolding area UFA2 of the surface of the first circuit board 300a may face different directions. In this case, a first driving IC 330a disposed in the first unfolding area UFA1 and a second driving IC 350a disposed in the second unfolding area UFA2 may face different directions.

As illustrated in FIGS. 8 and 9, the first driving IC 330a and the second driving IC 350a may be aligned in a direction from the first unfolding area UFA1 toward the folding area FA. That is, the first driving IC 330a and the second driving IC 350a may overlap each other in the direction from the first unfolding area UFA1 toward the folding area FA.

In some exemplary embodiments, the first driving IC 330a and the second driving IC 350a of the first circuit board 300a of the display device 2 may not overlap each other in the direction from the first unfolding area UFA1 toward the folding area FA, for example, in the first direction DR1, as in the exemplary embodiment of FIGS. 1 through 7.

Figure 10:
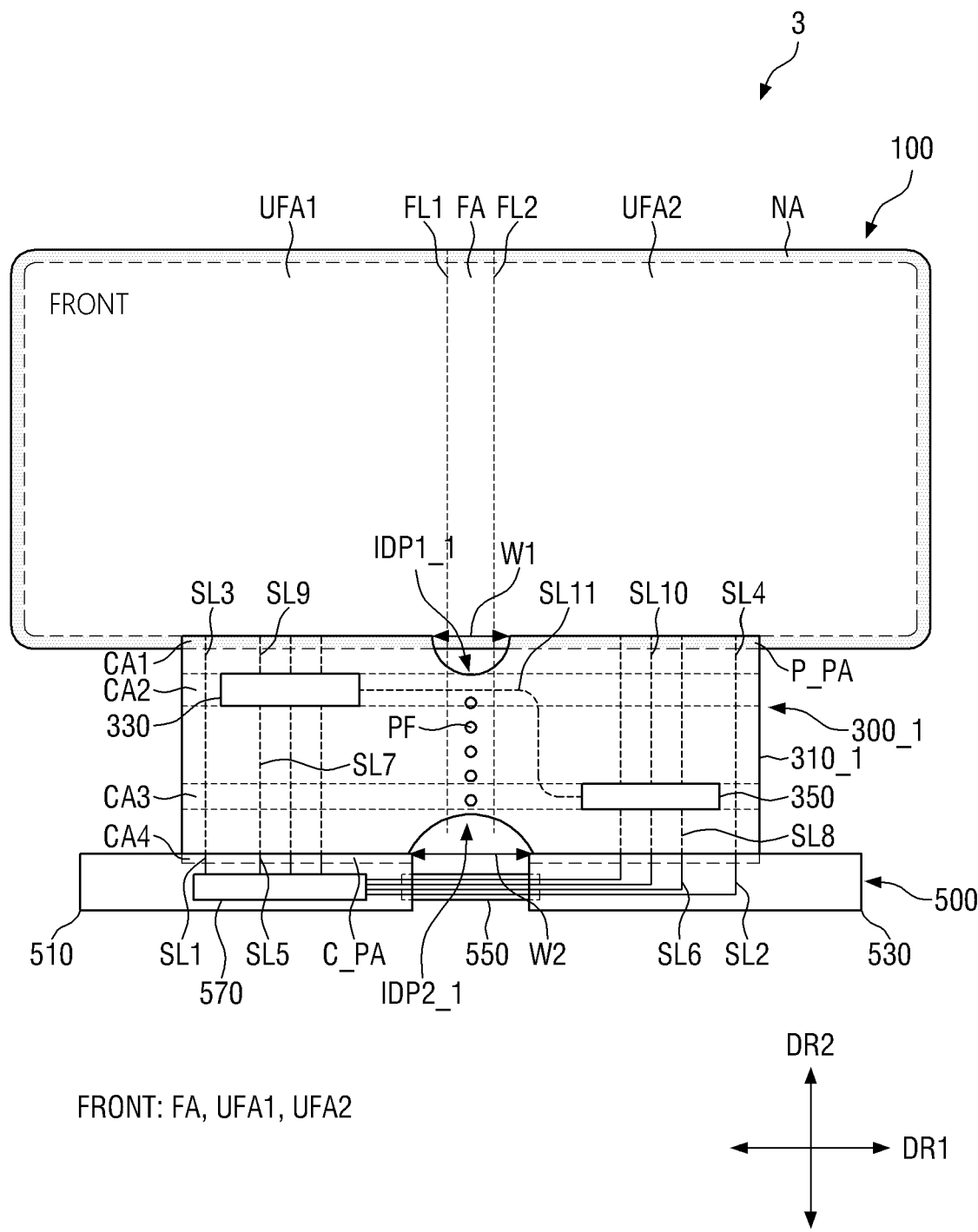
FIG. 10 is a plan view of an exemplary embodiment of a display device.

FIG. 10 is a plan view of an exemplary embodiment of a display device 3.

Referring to FIG. 10, the display device 3 in the current exemplary embodiment is different from the display device 1 in the exemplary embodiment of FIGS. 1 through 7 in that indented portions IDP1_1 and IDP2_1 of a first circuit board 300_1 have different widths.

More specifically, in the current exemplary embodiment of the display device 3, the indented portions IDP1_1 and IDP2_1 of the first circuit board 300_1 may have different widths in a direction from a first unfolding area UFA1 toward a folding area FA, for example, in the first direction DR1.

That is, a first width W1 of a first indented portion IDP1_1 of the first circuit board 300_1 may be smaller than a second width W2 of a second indented portion IDP2_1 of the first circuit board 300_1.

As described above in the exemplary embodiment of FIGS. 1 through 7, the first indented portion IDP1_1 may be defined in a first circuit area CA1 of the first circuit board 300_1. When the first width W1 of the first indented portion IDP1_1 of the first circuit board 300_1 is smaller than the second width W2 of the second indented portion IDP2_1 of the first circuit board 300_1 as in the current exemplary embodiment, the first circuit area CA1 of the first circuit board 300_1 may have a greater width in the first direction DR1. Therefore, more lead wirings may be placed in the first circuit area CA1 of the first circuit board 300_1 to transmit signals to a plurality of wiring pads of a panel pad area P_PA of a display panel 150.

In this exemplary embodiment as well, when a display module 100 is folded, the first circuit board 300_1 and a second circuit board 500 may also be folded together with the display module 100. Here, the first indented portion IDP1_1 and the second indented portion IDP2_1 defined in the folding area FA of the first circuit board 300_1 as described above may ensure the flexibility of the first circuit board 300_1 during folding in an area where the first circuit board 300_1 is attached to each of a display panel 150 and the second circuit board 500.

Further, a plurality of folding holes PF defined in the folding area FA of the first circuit board 300_1 may further ensure the flexibility of the first circuit board 300_1 during folding, like the indented portions IDP1_1 and IDP2_1.

In addition, since a first driving IC 330 and a second driving IC 350 of the first circuit board 300_1 of the display device 3 in the current exemplary embodiment are disposed not to overlap each other in the direction from the first unfolding area UFA1 toward the folding area FA, for example, in the first direction DR1, when the display device 3 is out-folded, a direct contact between the driving ICs 330 and 350 is prevented, thereby preventing the driving ICs 330 and 350 from being physically damaged.

Figure 11:
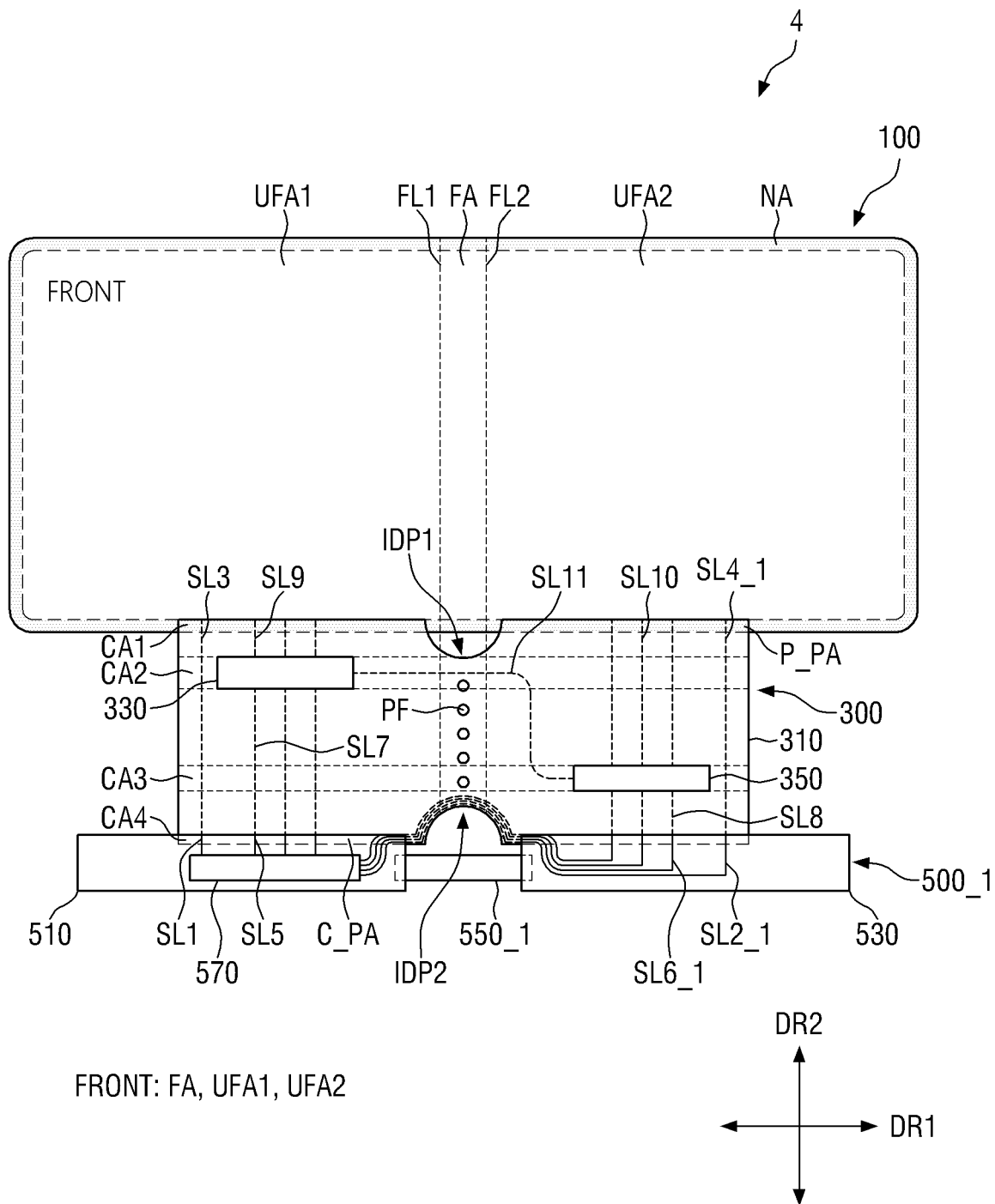
FIG. 11 is a plan view of an exemplary embodiment of a display device.

FIG. 11 is a plan view of an exemplary embodiment of a display device 4.

Referring to FIG. 11, the display device 4 in the current exemplary embodiment is different from the display device 1 in the exemplary embodiment of FIGS. 1 through 7 in an area where a second signal wiring SL2_1 and a fourth signal wiring SL4_1 of a second circuit board 500_1 are disposed.

More specifically, in the current exemplary embodiment of the second circuit board 500_1, the second signal wiring SL2_1 and the fourth signal wiring SL4_1 extending from a third driving IC 570 disposed on a first base substrate 510 may be connected to a second base substrate 530 through a first circuit board 300 without being disposed on a flexible film 550_1.

In an exemplary embodiment, the second signal wiring SL2_1 and the fourth signal wiring SL4_1 extending from the third driving IC 570 may be connected to a first unfolding area UFA1 of the first circuit board 300, for example. Although not illustrated, the first circuit board 300 may further include a lead wiring connected to the second signal wiring SL2_1 and the fourth signal wiring SL4_1.

The lead wiring of the first circuit board 300 may extend to a second unfolding area UFA2 of the first circuit board 300 along a second indented portion IDP2 of the first circuit board 300 as illustrated in FIG. 11.

The lead wiring of the first circuit board 300 which extends to the second unfolding area UFA2 of the first circuit board 300 may be connected to the second base substrate 530.

In some exemplary embodiments, the arrangement of the second signal wiring SL2_1 and the fourth signal wiring SL4_1 in the current exemplary embodiment and the arrangement of the second signal wiring SL2 and the fourth signal wiring SL4 in the exemplary embodiment of FIGS. 1 through 7 may be combined.

In this exemplary embodiment as well, when a display module 100 is folded, the first circuit board 300 and the second circuit board 500_1 may also be folded together with the display module 100. Here, a first indented portion IDP1 and the second indented portion IDP2 defined in a folding area FA of the first circuit board 300 as described above may ensure the flexibility of the first circuit board 300 during folding in an area where the first circuit board 300 is attached to each of a display panel 150 and the second circuit board 500_1.

Further, a plurality of folding holes PF defined in the folding area FA of the first circuit board 300 may further ensure the flexibility of the first circuit board 300 during folding, like the indented portions IDP1 and IDP2.

In addition, since a first driving IC 330 and a second driving IC 350 of the first circuit board 300 of the display device 4 in the current exemplary embodiment are disposed not to overlap each other in a direction from the first unfolding area UFA1 toward the folding area FA, for example, in the first direction DR1, when the display device 4 is out-folded, a direct contact between the driving ICs 330 and 350 is prevented, thereby preventing the driving ICs 330 and 350 from being physically damaged.

Figure 12:
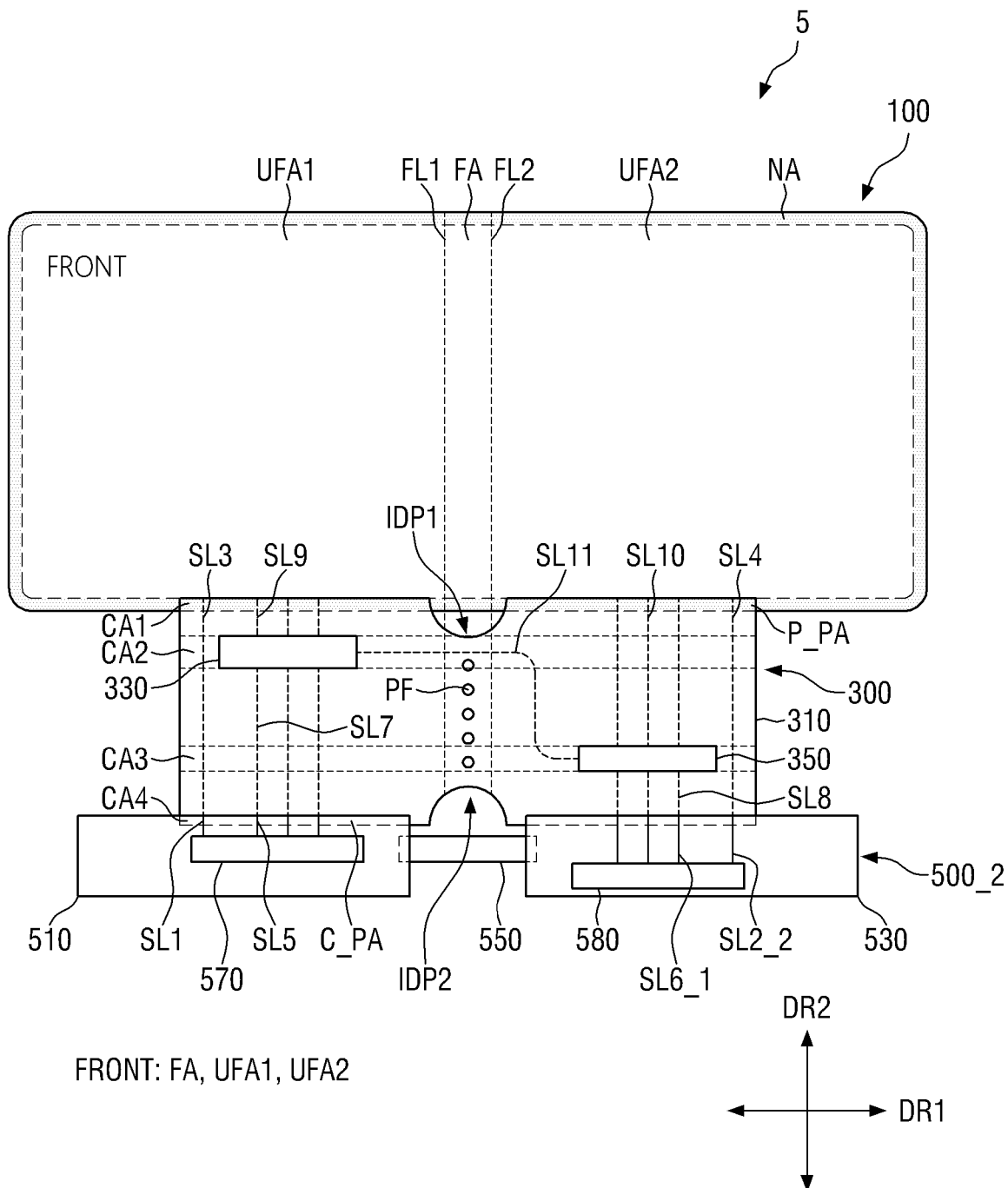
FIG. 12 is a plan view of an exemplary embodiment of a display device.

FIG. 12 is a plan view of an exemplary embodiment of a display device 5.

Referring to FIG. 12, the display device 5 in the current exemplary embodiment is different from the display device 1 in the exemplary embodiment of FIGS. 1 through 7 in that a fourth driving IC 580 is further disposed on a second base substrate 530 of a second circuit board 500_2.

More specifically, the second circuit board 500_2 may include first and second base substrates 510 and 530, a third driving IC 570 disposed on the first base substrate 510, the fourth driving IC 580 disposed on the second base substrate 530, a flexible film 550 disposed on the base substrates 510 and 530, and a plurality of signal wirings SL1, SL2_2, SL5 and SL6_1.

The third driving IC 570 and the fourth driving IC 580 of the second circuit board 500_2 of the display device 5 may be disposed not to overlap each other in a direction from a first unfolding area UFA1 toward a folding area FA, for example, in the first direction DR1. Therefore, when the display device 5 is out-folded, a direct contact between the driving ICs 570 and 580 is prevented, thereby preventing the driving ICs 570 and 580 from being physically damaged.

However, when the display device 5 is in-folded as in the exemplary embodiment of FIGS. 8 and 9, a surface of the second circuit board 500_2 on which the driving ICs 570 and 580 are disposed may face different directions. That is, the third driving IC 570 and the fourth driving IC 580 may face different directions. In this case, the third driving IC 570 and the fourth driving IC 580 may be aligned in the direction from the first unfolding area UFA1 toward the folding area FA. That is, the third driving IC 570 and the fourth driving IC 580 may overlap each other in the direction from the first unfolding area UFA1 toward the folding area FA.

The fourth driving IC 580, like the third driving IC 570, may include a source/drain IC and a voltage driver.

A second signal wiring SL2_2 of the second circuit board 500_2 may connect the fourth driving IC 580 and a first circuit board 300. In an exemplary embodiment, the second signal wiring SL2_2 may deliver a voltage applied by the voltage driver of the fourth driving IC 580 to a fourth signal wiring SL4 of the first circuit board 300, for example.

A sixth signal wiring SL6_1 of the second circuit board 500_2 may connect the fourth driving IC 580 and the first circuit board 300. In an exemplary embodiment, the sixth signal wiring SL6_1 may deliver a data signal transmitted by the source/drain IC of the fourth driving IC 580 to an eighth signal wiring SL8 of the first circuit board 300, for example.

In some exemplary embodiments, each of the driving ICs 570 and 580 may further include a timing controller, and a first driving IC 330 and a second driving IC 350 may not include the timing controller. In this case, a timing synchronization wiring may be further provided on the flexible film 550 of the second circuit board 500_2 to connect the third driving IC 570 and the fourth driving IC 580.

In this exemplary embodiment as well, when a display module 100 is folded, the first circuit board 300 and the second circuit board 500_2 may also be folded together with the display module 100. Here, a first indented portion IDP1 and a second indented portion IDP2 defined in the folding area FA of the first circuit board 300 as described above may ensure the flexibility of the first circuit board 300 during folding in an area where the first circuit board 300 is attached to each of a display panel 150 and the second circuit board 500_2.

Further, a plurality of folding holes PF defined in the folding area FA of the first circuit board 300 may further ensure the flexibility of the first circuit board 300 during folding, like the indented portions IDP1 and IDP2.

In addition, since the first driving IC 330 and the second driving IC 350 of the first circuit board 300 of the display device 5 in the current exemplary embodiment are disposed not to overlap each other in the direction from the first unfolding area UFA1 toward the folding area FA, for example, in the first direction DR1, when the display device 5 is out-folded, a direct contact between the driving ICs 330 and 350 is prevented, thereby preventing the driving ICs 330 and 350 from being physically damaged.

Figure 13:
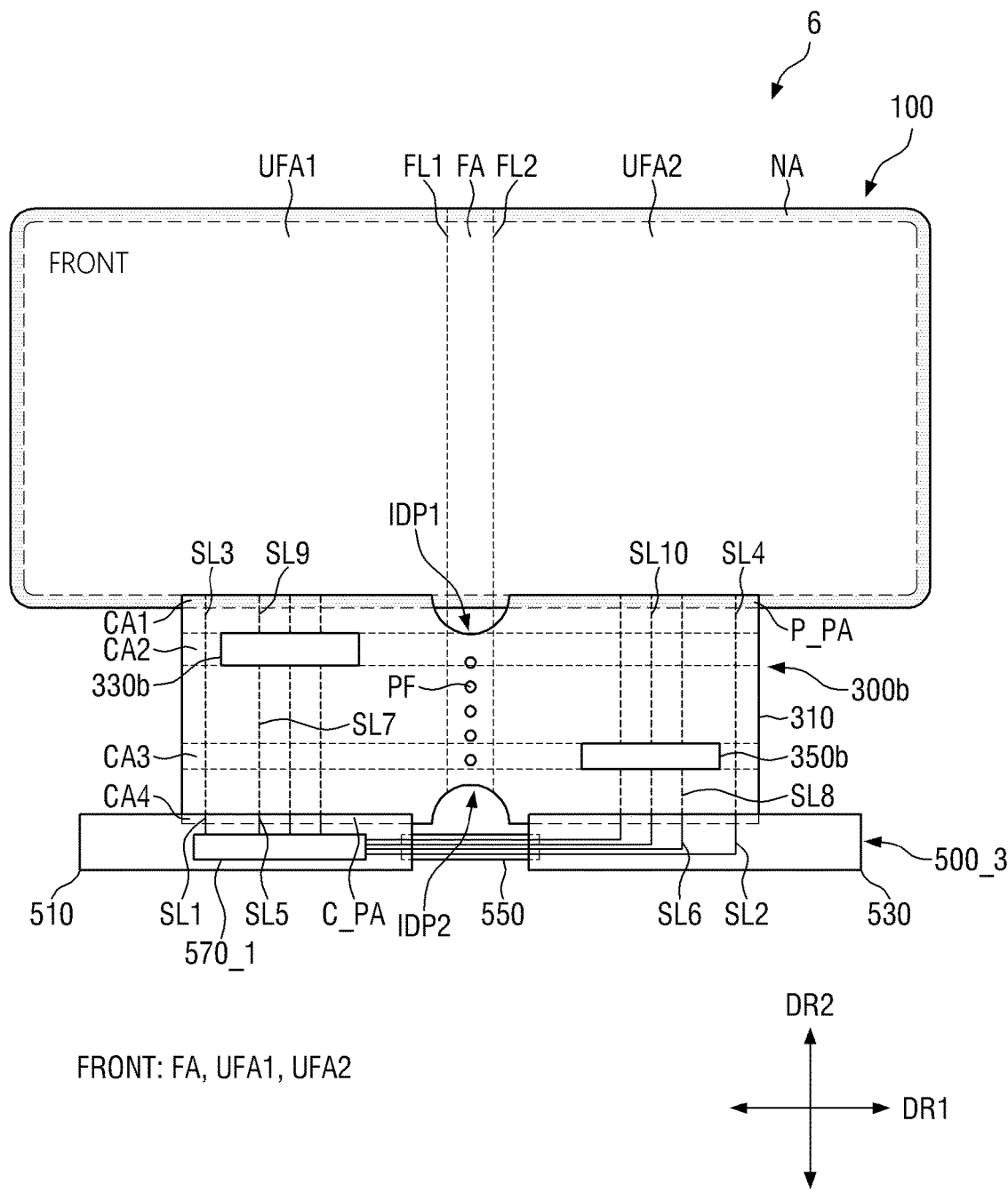
FIG. 13 is a plan view of an exemplary embodiment of a display device.

FIG. 13 is a plan view of an exemplary embodiment of a display device 6.

Referring to FIG. 13, the display device 6 in the current exemplary embodiment is different from the display device 1 in the exemplary embodiment of FIGS. 1 through 7 in that a third driving IC 570_1 of a second circuit board 500_3 further includes a timing controller.

More specifically, the third driving IC 570_1 of the second circuit board 500_3 may further include a timing controller. A timing signal output from the timing controller may be transmitted to driving ICs 330b and 350b of a first circuit board 300b.

Further, a first driving IC 330b and a second driving IC 350b may not include a timing controller, unlike the first driving IC 330 and the second driving IC 350 in the exemplary embodiment of FIGS. 1 through 7.

The first circuit board 300b of the display device 6 in the current exemplary embodiment may not include an eleventh signal wiring SL11.

In this exemplary embodiment as well, when a display module 100 is folded, the first circuit board 300b and the second circuit board 500_3 may also be folded together with the display module 100. Here, a first indented portion IDP1 and a second indented portion IDP2 defined in a folding area FA of the first circuit board 300b as described above may ensure the flexibility of the first circuit board 300b during folding in an area where the first circuit board 300b is attached to each of a display panel 150 and the second circuit board 500_3.

Further, a plurality of folding holes PF defined in the folding area FA of the first circuit board 300b may further ensure the flexibility of the first circuit board 300b during folding, like the indented portions IDP1 and IDP2.

In addition, since the first driving IC 330b and the second driving IC 350b of the first circuit board 300b of the display device 6 in the current exemplary embodiment are disposed not to overlap each other in a direction from a first unfolding area UFA1 toward the folding area FA, for example, in the first direction DR1, when the display device 6 is out-folded, a direct contact between the driving ICs 330b and 350b is prevented, thereby preventing the driving ICs 330b and 350b from being physically damaged.

Figure 14:
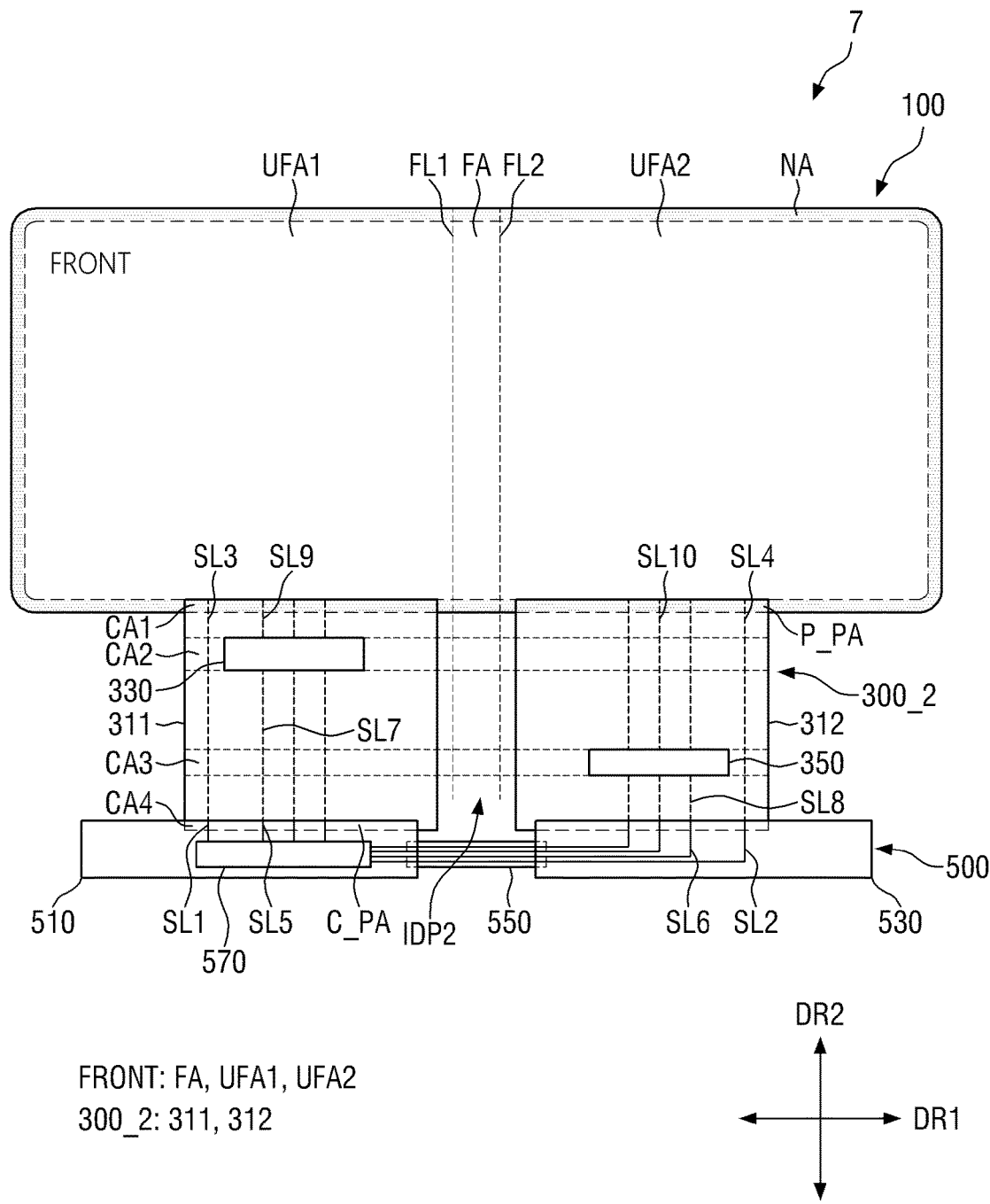
FIG. 14 is a plan view of an exemplary embodiment of a display device.

FIG. 14 is a plan view of an exemplary embodiment of a display device 7.

Referring to FIG. 14, the display device 7 in the current exemplary embodiment is different from the display device 1 in the exemplary embodiment of FIGS. 1 through 7 in that a first circuit board 300_2 is separated into two parts with a folding area FA interposed between them.

More specifically, the first circuit board 300_2 in the current exemplary embodiment may include a first sub-circuit board 311 disposed in a first unfolding area UFA1 and a second sub-circuit board 312 disposed in a second unfolding area UFA2. The first sub-circuit board 311 and the second sub-circuit board 312 may be separated from each other with the folding area FA interposed between them.

In the current exemplary embodiment of the display device 7, since the first circuit board 300_2 includes the two sub-circuit boards 311 and 312 separated from each other with the folding area FA interposed between them, the flexibility of the first circuit board 300_2 may be further ensured when the first circuit board 300_2 disposed on a back surface of a display module 100 is folded together with the display module 100.

In addition, since a first driving IC 330 and a second driving IC 350 of the first circuit board 300_2 of the display device 7 in the current exemplary embodiment are disposed not to overlap each other in a direction from the first unfolding area UFA1 toward the folding area FA, for example, in the first direction DR1, when the display device 7 is out-folded, a direct contact between the driving ICs 330 and 350 is prevented, thereby preventing the driving ICs 330 and 350 from being physically damaged.

Figure 15:
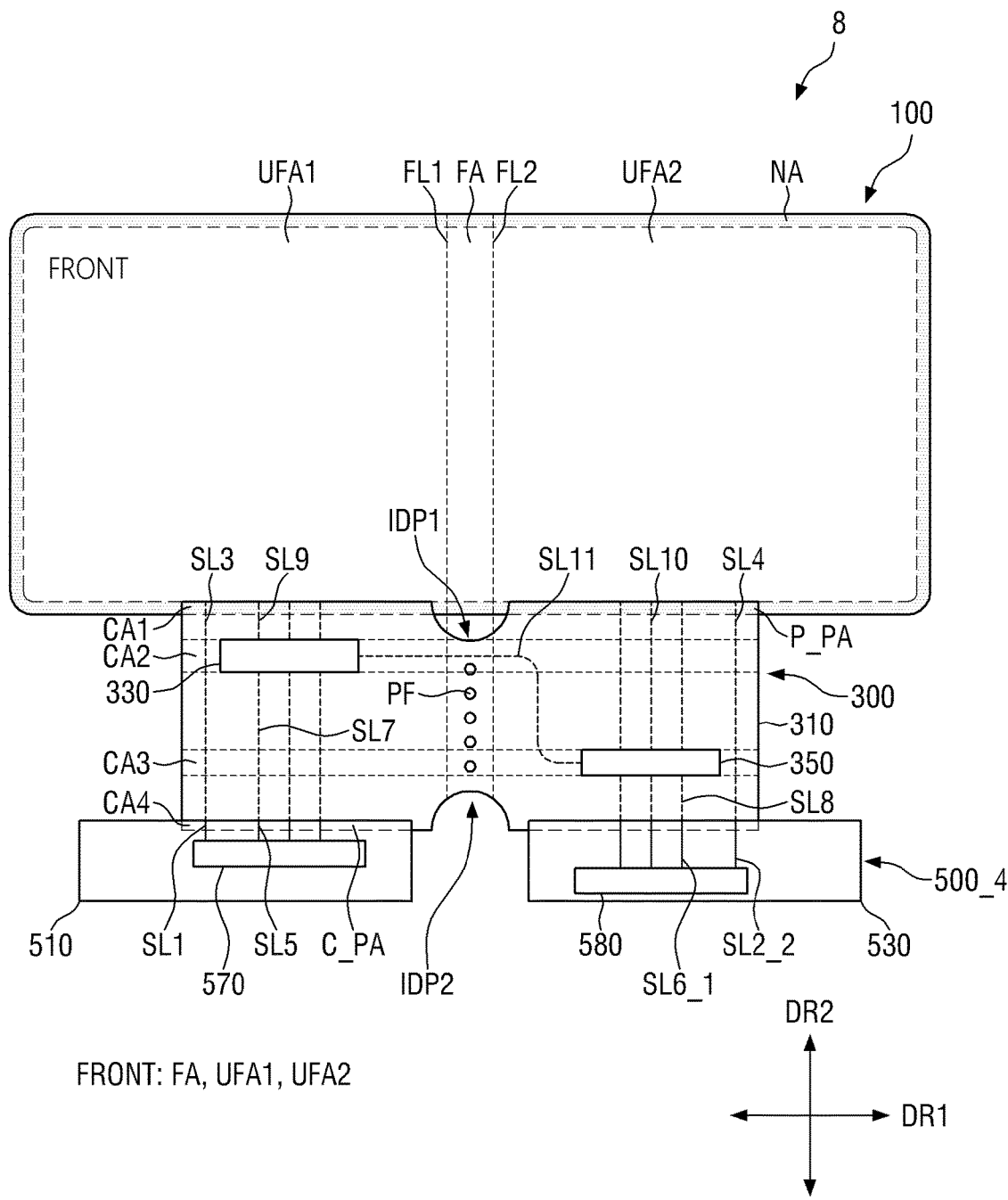
FIG. 15 is a plan view of an exemplary embodiment of a display device.

FIG. 15 is a plan view of an exemplary embodiment of a display device 8.

Referring to FIG. 15, the display device 8 in the current exemplary embodiment is different from the display device 5 in the exemplary embodiment of FIG. 12 in that a second circuit board 500_4 does not include a flexible film 550.

More specifically, the second circuit board 500_4 in the current exemplary embodiment may not include the flexible film 550 which is disposed in a folding area FA and connects a first base substrate 510 and a second base substrate 530. That is, the first base substrate 510 and the second base substrate 530 may be physically separated from each other.

Since the display device 8 in the current exemplary embodiment includes the second circuit board 500_4 physically separated into two parts in the folding area FA, the flexibility of the second circuit board 500_4 may be further ensured in the folding area FA when the second circuit board 500_4 disposed on a back surface of a display module 100 is folded together with the display module 100.

A third driving IC 570 and a fourth driving IC 580 of the second circuit board 500_4 of the display device 8 are disposed not to overlap each other in a direction from a first unfolding area UFA1 toward the folding area FA, for example, in the first direction DR1 as illustrated in FIG. 15. Therefore, when the display device 8 is out-folded, a direct contact between the driving ICs 570 and 580 is prevented, thereby preventing the driving ICs 570 and 580 from being physically damaged.

However, when the display device 8 is in-folded as in the exemplary embodiment of FIGS. 8 and 9, the third driving IC 570 and the fourth driving IC 580 may be aligned in the direction from the first unfolding area UFA1 toward the folding area FA.

In this exemplary embodiment as well, when the display module 100 is folded, a first circuit board 300 and the second circuit board 500_4 may also be folded together with the display module 100. Here, a first indented portion IDP1 and a second indented portion IDP2 defined in the folding area FA of the first circuit board 300 as described above may ensure the flexibility of the first circuit board 300 during folding in an area where the first circuit board 300 is attached to each of a display panel 150 and the second circuit board 500_4.

Further, a plurality of folding holes PF defined in the folding area FA of the first circuit board 300 may further ensure the flexibility of the first circuit board 300 during folding, like the indented portions IDP1 and IDP2.

In addition, since a first driving IC 330 and a second driving IC 350 of the first circuit board 300 of the display device 8 in the current exemplary embodiment are disposed not to overlap each other in the direction from the first unfolding area UFA1 toward the folding area FA, for example, in the first direction DR1, when the display device 8 is out-folded, a direct contact between the driving ICs 330 and 350 is prevented, thereby preventing the driving ICs 330 and 350 from being physically damaged.

Figure 16:
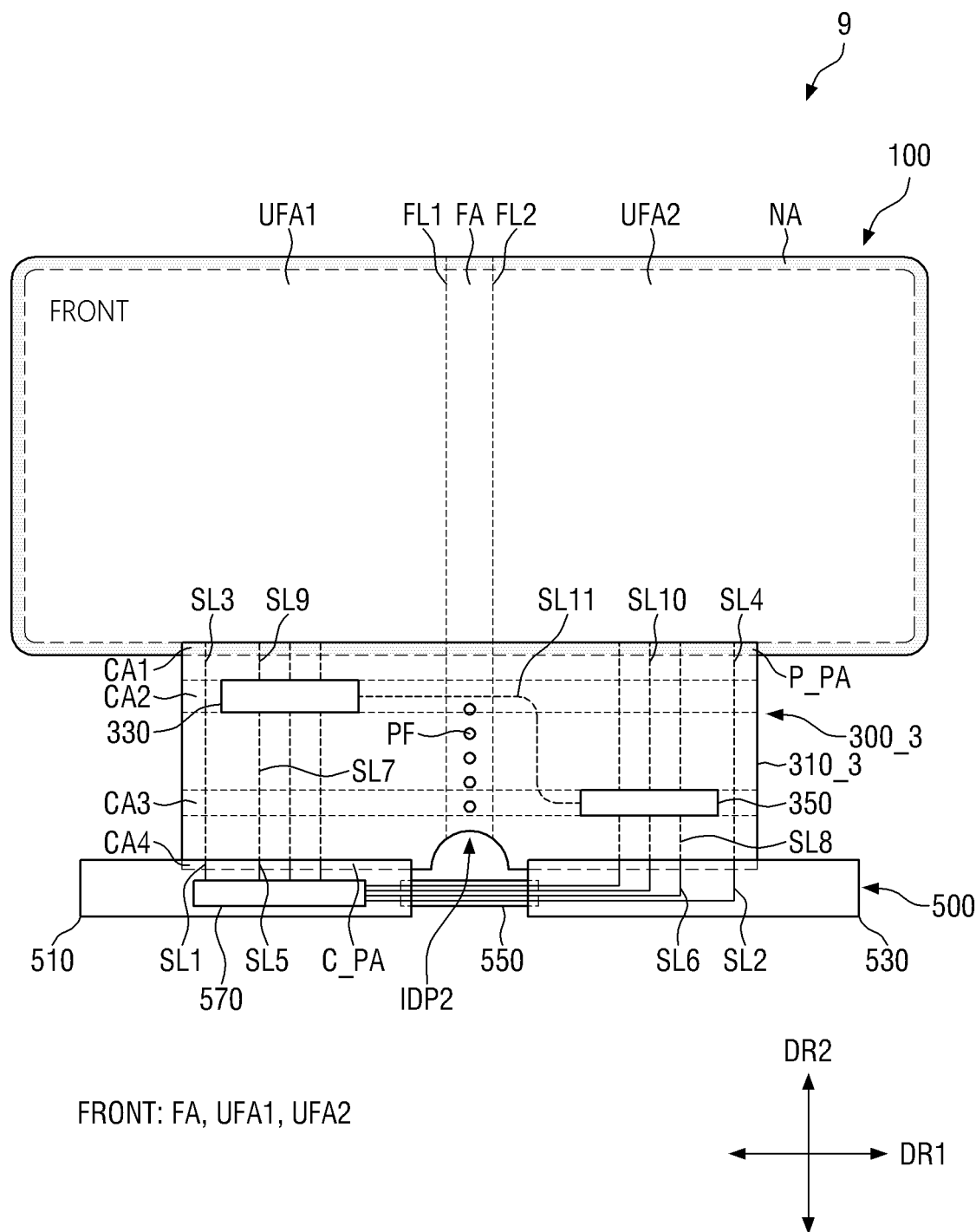
FIG. 16 is a plan view of an exemplary embodiment of a display device.

FIG. 16 is a plan view of an exemplary embodiment of a display device 9.

Referring to FIG. 16, the display device 9 in the current exemplary embodiment is different from the display device 1 in the exemplary embodiment of FIGS. 1 through 7 in that a first circuit board 300_3 does not include a first indented portion IDP1.

More specifically, a first long edge LEG1 of the first circuit board 300_3 in the current exemplary embodiment may be substantially shaped like a straight line along the first direction DR1. Therefore, a first circuit area CA1 of the first circuit board 300_3 may have a greater width in the first direction DR1, and more lead wirings may be placed in the first circuit area CA1 of the first circuit board 300_3 to deliver signals to a plurality of wiring pads of a panel pad area P_PA of a display panel 150. Accordingly, more signal channels may be secured between the first circuit board 300_3 and the display panel 150.

A plurality of folding holes PF of the first circuit board 300_3 may be disposed between the first long edge LEG1 and a second indented portion IDP2 of the first circuit board 300_3.

In this exemplary embodiment as well, when a display module 100 is folded, the first circuit board 300_3 and a second circuit board 500 may also be folded together with the display module 100. Here, the second indented portion IDP2 defined in a folding area FA of the first circuit board 300_3 as described above may ensure the flexibility of the first circuit board 300_3 during folding in an area where the first circuit board 300_3 is attached to each of the display panel 150 and the second circuit board 500.

Further, the folding holes PF defined in the folding area FA of the first circuit board 300_3 may further ensure the flexibility of the first circuit board 300_3 during folding, like the indented portion IDP2.

In addition, since a first driving IC 330 and a second driving IC 350 of the first circuit board 300_3 of the display device 9 in the current exemplary embodiment are disposed not to overlap each other in a direction from a first unfolding area UFA1 toward the folding area FA, for example, in the first direction DR1, when the display device 9 is out-folded, a direct contact between the driving ICs 330 and 350 is prevented, thereby preventing the driving ICs 330 and 350 from being physically damaged.

Figure 17:
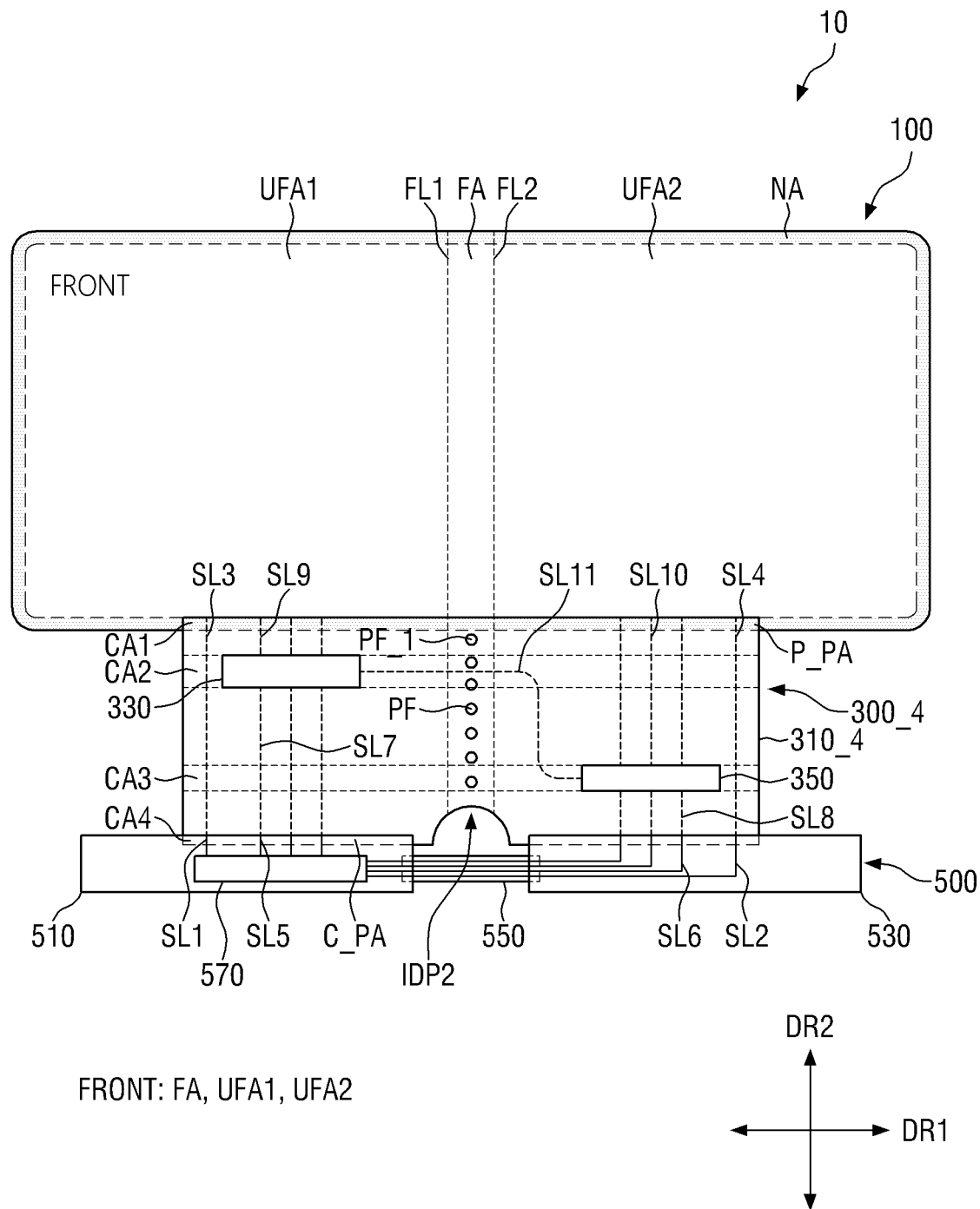
FIG. 17 is a plan view of an exemplary embodiment of a display device.

FIG. 17 is a plan view of an exemplary embodiment of a display device 10.

Referring to FIG. 17, the display device 10 in the current exemplary embodiment is different from the display device 9 in the exemplary embodiment of FIG. 16 in that a plurality of sub-folding holes PF_1 may be further defined between a first long edge LEG1 of a first circuit board 300_4 and an area in which a plurality of folding holes PF are defined.

More specifically, in the first circuit board 300_4 in the current exemplary embodiment, the sub-folding holes PF_1 may be further defined between the first long edge LEG1 and the area in which the folding holes PF are defined.

The sub-folding holes PF_1, like the folding holes PF, may be through holes passing through a base film 310_4 of the first circuit board 300_4 in the thickness direction.

The sub-folding holes PF_1 may have substantially the same or similar planar shape as that of the folding holes PF, but may also have a different planar shape from that of the folding holes PF.

Although the number of the sub-folding holes PF_1 is two in FIG. 17, the number of the sub-folding holes PF_1 is not limited to two and may also be one, or three or more.

In the display device 10 in the current exemplary embodiment, since the sub-folding holes PF_1 are further disposed between the first long edge LEG1 of the first circuit board 300_4 and the area in which the folding holes PF are disposed, the flexibility of the first circuit board 300_4 may be ensured during the folding of the first circuit board 300_4.

Figure 18:
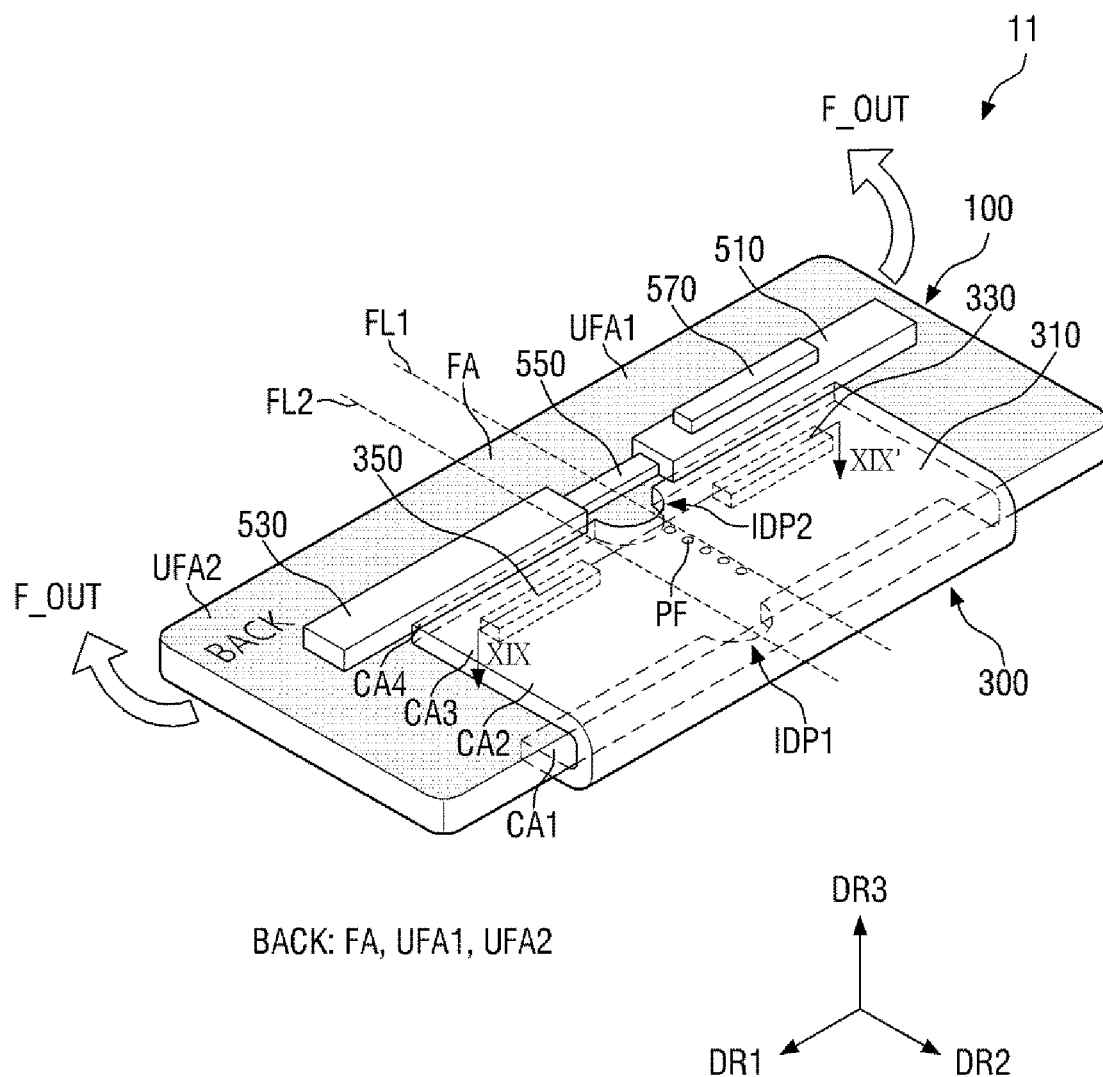
FIG. 18 is a perspective view of an exemplary embodiment of a display device.
Figure 19:
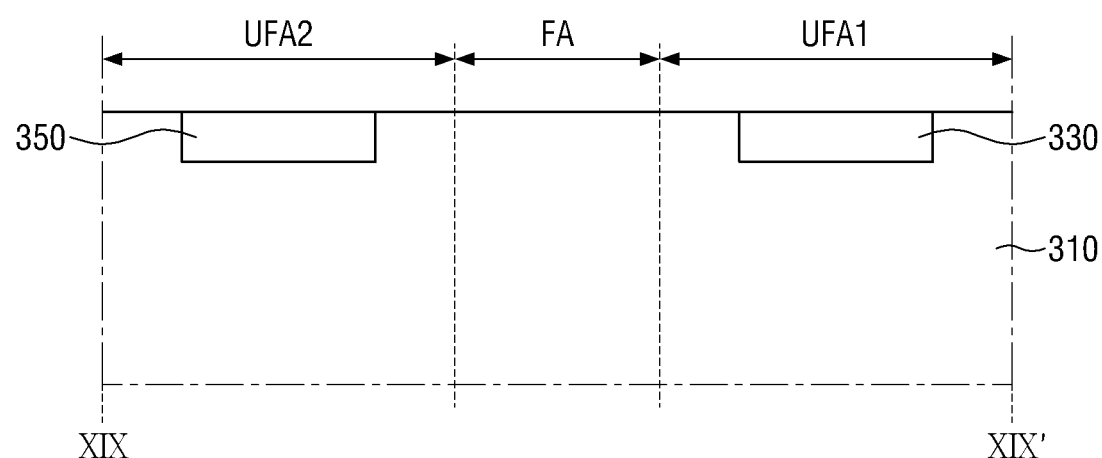
FIG. 19 is a cross-sectional view taken along line XIX-XIX' of FIG. 18.
Figure 19:
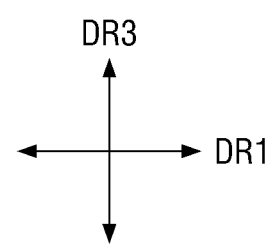

FIG. 18 is a perspective view of an exemplary embodiment of a display device 11. FIG. 19 is a cross-sectional view taken along line XIX-XIX' of FIG. 18.

Referring to FIGS. 18 and 19, the display device 11 in the current exemplary embodiment is different from the display device 1 in the exemplary embodiment of FIGS. 1 through 7 in that each of first and second driving ICs 330 and 350 is disposed inside a first circuit board 300.

More specifically, the first driving IC 330 and the second driving IC 350 may be aligned along the first direction DR1. The first driving IC 330 and the second driving IC 350 may be disposed inside a base film 310 of the first circuit board 300. Although surfaces of the first and second driving ICs 330 and 350 are aligned with a surface of the base film 310 in FIGS. 18 and 19, the invention is not limited to this case, and the surfaces of the first and second driving ICs 330 and 350 may also be lower than an adjacent surface of the base film 310.

In the current exemplary embodiment of the display device 11, since the first and second driving ICs 330 and 350 are disposed inside the first circuit board 300 and their surfaces are located lower than the surface of the base film 310, the first and second driving ICs 330 and 350 may be prevented from being physically damaged due to a physical contact when the display device 11 is folded.

Figure 20:
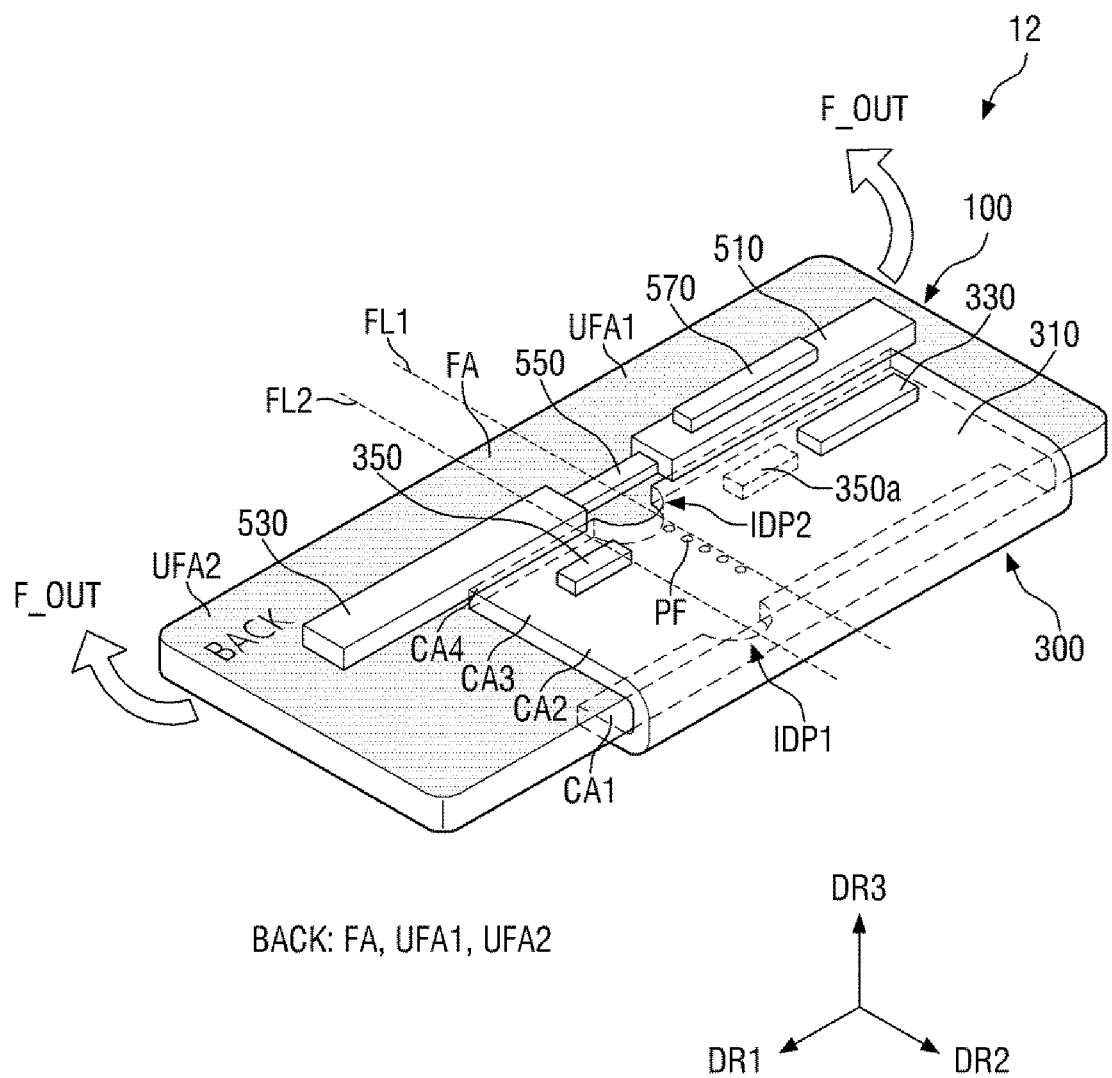
FIG. 20 is a perspective view of an exemplary embodiment of a display device.

FIG. 20 is a perspective view of an exemplary embodiment of a display device 12.

Referring to FIG. 20, the display device 12 in the current exemplary embodiment is different from the display device 1 in the exemplary embodiment of FIGS. 1 through 7 in that first and second driving ICs 330 and 350 are spaced apart from a folding area FA by different distances.

More specifically, in the display device 12 in the current exemplary embodiment, the first and second driving ICs 330 and 350 may be aligned along the first direction DR1 from the folding area FA. In addition, the area of a first circuit board 300 may be different on one side and the other side of the folding area FA in the first direction DR1. In an exemplary embodiment, as illustrated in FIG. 20, the area of a side of the first circuit board 300 in the first direction DR1 on which the first driving IC 330 is disposed may be larger than the area of the other side in the first direction DR1 on which the second driving IC 350 is disposed, for example. The distance from the folding area FA to the first driving IC 330 may be greater than the distance from the folding area FA to the second driving IC 350. In the current exemplary embodiment, the distance from the folding area FA to the first driving IC 330 may be greater than the sum of the distance between the second driving IC 350 and the folding area FA and a length of the second driving IC 350 in the first direction DR1.

Therefore, when the display device 12 is folded, the first driving IC 330 and the second driving IC 350 may be prevented from overlapping each other in the thickness direction, thereby preventing defects of the display device 12.

In an exemplary embodiment of a display device, driving ICs disposed on an FPCB may be prevented from contacting each other during bending.

In addition, it is possible to provide a display device including an FPCB having flexibility in a folding area.

However, the effects of the exemplary embodiments are not restricted to the one set forth herein. The above and other effects of the exemplary embodiments will become more apparent to one of daily skill in the art to which the exemplary embodiments pertain by referencing the claims.

What is claimed is:

1. An electronic device including a folding area, a first area located on a side of the folding area, and a second area located on a second side of the folding area, the electronic device comprising:
a display panel; and
a first circuit board attached to the display panel, the first circuit board comprising:
a base film,
a first driving integrated circuit disposed in the first area, and
a second driving integrated circuit disposed in the second area,
wherein the first driving integrated circuit and the second driving integrated circuit do not overlap each other in a thickness direction of the base film during folding.

2. The electronic device of claim 1, wherein a first indented portion is recessed from a first edge of the first circuit board attached to the display panel in the folding area.

3. The electronic device of claim 2, further comprising a second circuit board which comprises a first base substrate attached to the first area of a second edge facing the first edge of the first circuit board and a second base substrate attached to the second area of the second edge, wherein a second indented portion of the first circuit board is recessed from the second edge in the folding area.

4. The electronic device of claim 3, wherein a first width of the first indented portion in a direction from the first area toward the folding area is smaller than a second width of the second indented portion in the direction from the first area toward the folding area.

5. The electronic device of claim 3, wherein a plurality of folding holes is defined in the first circuit board between the first indented portion and the second indented portion in the folding area, wherein the plurality of folding holes passes through the first circuit board in the thickness direction.

6. The electronic device of claim 3, wherein the second circuit board further comprises a flexible film disposed in the folding area, wherein the flexible film connects the first base substrate and the second base substrate.

7. The electronic device of claim 6, wherein the first base substrate comprises a third driving integrated circuit and a first signal wiring which connects the third driving integrated circuit and the first circuit board, wherein the first signal wiring is disposed over the flexible film.

8. The electronic device of claim 6, wherein the first base substrate comprises a third driving integrated circuit and a first signal wiring which connects the third driving integrated circuit and the first circuit board, wherein the first signal wiring is disposed over the first circuit board along the second indented portion of the first circuit board.

9. The electronic device of claim 1, further comprising a signal wiring which directly connects the first driving integrated circuit and the second driving integrated circuit, wherein the signal wiring is a timing synchronization wiring.

10. The electronic device of claim 1, wherein the first circuit board further comprises a first sub-circuit board on which the first driving integrated circuit is disposed and a second sub-circuit board on which the second driving integrated circuit is disposed,
wherein the first sub-circuit board and the second sub-circuit board are separated from each other with the folding area interposed between the first sub-circuit board and the second sub-circuit board.

11. The electronic device of claim 1, wherein the first circuit board further comprises a first edge attached to the display panel and a second edge facing the first edge, and
an indented portion is recessed from the second edge of the first circuit board.

12. The electronic device of claim 11, wherein a plurality of folding holes is defined in the first circuit board between the indented portion and the first edge of the first circuit board in the folding area, wherein the plurality of folding holes passes through the first circuit board in the thickness direction.

13. The electronic device of claim 1,
wherein the electronic device further comprises a display module including the display panel,
wherein the display module further comprises a first surface on which the first circuit board is disposed and a second surface which is located opposite the first surface, wherein the first area of the first surface of the display module and the second area of the first surface of the display module face each other with respect to the folding area of the first surface.

14. The electronic device of claim 1, wherein a first area of the first circuit board which overlaps the first area has a greater width than a second area of the first circuit board which overlaps the second area, and a distance from the folding area to the first driving integrated circuit is greater than a distance from the folding area to the second driving integrated circuit.

15. An electronic device including a folding area, a first area located on a side of the folding area, and a second area located on a second side of the folding area, the electronic device comprising:
a display panel; and
a first circuit board which comprises a first edge attached to the display panel,
wherein a first indented portion is recessed from the first edge of the first circuit board in the folding area, and
wherein a plurality of folding holes is defined in the first circuit board between the first indented portion and a second edge facing the first edge of the first circuit board in the folding area, wherein the folding holes pass through the first circuit board in a thickness direction of the first circuit board.

16. The electronic device of claim 15, further comprising a second circuit board which comprises a first base substrate attached to the first area of the second edge facing the first edge of the first circuit board and a second base substrate attached to the second area of the second edge.

17. The electronic device of claim 16, wherein a second indented portion is recessed from the second edge of the first circuit board in the folding area.

18. The electronic device of claim 15,
wherein the electronic device further comprises a display module including the display panel,
wherein the display module further comprises a first surface on which the first circuit board is disposed and a second surface which is located opposite the first surface, wherein the first area of the first surface of the display module and the second area of the second surface of the display module face each other with respect to the folding area of the second surface.

* * * * *